US008391821B2

(12) United States Patent
Okabe

(10) Patent No.: US 8,391,821 B2
(45) Date of Patent: Mar. 5, 2013

(54) RADIO FREQUENCY CIRCUIT FOR MULTI-MODE OPERATION

(75) Inventor: Hiroshi Okabe, Koganei (JP)

(73) Assignee: Renesas Electronics Corporation, Kanagawa (JP)

( * ) Notice: Subject to any disclaimer, the term of this patent is extended or adjusted under 35 U.S.C. 154(b) by 948 days.

(21) Appl. No.: 11/444,398

(22) Filed: Jun. 1, 2006

(65) Prior Publication Data

US 2006/0276158 A1 Dec. 7, 2006

(30) Foreign Application Priority Data

Jun. 6, 2005 (JP) ................ 2005-165098

(51) Int. Cl.
*H04B 1/26* (2006.01)
(52) U.S. Cl. .......... 455/323; 455/553.1; 455/339
(58) Field of Classification Search ............ 455/76, 455/552.1, 324, 550.1, 553.1, 323, 314, 339
See application file for complete search history.

(56) References Cited

U.S. PATENT DOCUMENTS

| 6,384,676 | B2 | 5/2002 | Kasa et al. |
| 7,092,676 | B2* | 8/2006 | Abdelgany et al. ............ 455/76 |
| 7,194,242 | B2* | 3/2007 | Tanaka et al. ............ 455/127.3 |
| 7,321,159 | B2* | 1/2008 | Schatz ............ 257/622 |
| 2004/0240420 | A1 | 12/2004 | Nakai |
| 2005/0003789 | A1 | 1/2005 | Busch et al. |
| 2005/0176380 | A1 | 8/2005 | Okabe et al. |

FOREIGN PATENT DOCUMENTS

| CN | 1524402 A | 3/2002 |
| JP | 62-12147 | 7/1985 |
| JP | 10-200442 | 1/1997 |
| JP | 2001-244416 | 2/2000 |
| JP | 2001-267952 | 3/2000 |
| JP | 2003-249868 | 2/2002 |
| JP | 2004-032674 | 2/2003 |
| JP | 2005-223582 | 2/2004 |
| JP | 2006-524026 | 4/2004 |
| WO | WO 02/78201 A2 | 3/2002 |
| WO | WO 2004/095727 A1 | 4/2004 |

OTHER PUBLICATIONS

An Office Action from Chinese Patent Office dated Aug. 29, 2008 regarding Chinese Patent Application No. 2006100850213 in Chinese.
Office Action (Notification of Reason for Refusal) mailed Oct. 6, 2009.

* cited by examiner

*Primary Examiner* — Christian Hannon
(74) *Attorney, Agent, or Firm* — Stites & Harbison, PLLC; Juan Carlos A. Marquez, Esq; Nicholas B. Trenkle, Esq.

(57) ABSTRACT

In a radio frequency circuit for multi-mode operation on which multiple transceivers complying with multiple communication systems are disposed, signal interference between circuits is reduced. The PA 222, and the output matching networks 223a and 223b of GSM system, which are circuits independent of the circuit operation of W-CDMA, are disposed in a section of the shortest distance between the PA 121 that handles RF transmission signals of W-CDMA being a first communication system, a third output matching network and an isolator, and a receiver that handles RF received signal of W-CDMA, and in a section of the shortest distance between the PA 121 and the transmitter 130 of W-CDMA. The PA 222, which is a circuit independent of the circuit operation of W-CDMA, is disposed in a section of the shortest distance between the PA 121 and the inter stage filter 125 of W-CDMA.

19 Claims, 18 Drawing Sheets

DISTANCE BETWEEN LINES; D [mm]

—— ONLY LINES
--◇-- WITH ISOLATING CONDUCTOR
--◆-- WITH GROUNDED CONDUCTOR
—□— WITH ISOLATING CONDUCTOR AND GROUNDED CONDUCTOR AT ONE SIDE
—■— WITH ISOLATING CONDUCTOR AND GROUNDED CONDUCTORS AT BOTH SIDES

RADIO FREQUENCY CIRCUIT FOR MULTI-MODE OPERATION

CLAIM OF PRIORITY

The present patent application claims priority from Japanese application JP No. 2005-165098 filed on Jun. 6, 2005, the content of which is hereby incorporated by reference into this application.

FIELD OF THE INVENTION

The present invention relates to a radio frequency circuit used for wireless communication equipment, and more particularly to a radio frequency circuit for multi-mode operation with transceivers of multiple communication systems disposed on an identical substrate.

BACKGROUND OF THE INVENTION

In Japanese Patent Laid-open No. 2004-32674 (patent document 1), an example of a front end module is disclosed which accommodates two communication systems, Time Division Multiple Access (hereinafter referred to as TDMA) and Code Division Multiple Access (hereinafter referred to as CDMA). In the example, a diplexer connected to an antenna, and a radio frequency switch and a duplexer connected to the diplexer are integrated on one multilayer substrate for integration. The signal of the TDMA system and the signal of the CDMA system are separated by the diplexer, the transmission and received signals of the TDMA system are separated by the radio frequency switch, and the transmission and received signals of the CDMA system are separated by the duplexer.

In Japanese Patent Laid-open No. 2003-249868 (patent document 2), an example of a front end module is disclosed which is designed to accommodate two communication systems, Global System for Mobile communications (GSM) and Digital Communication System (DCS). In the example, a diplexer connected to an antenna, a low pass filter (LPF) of the GSM side connected to one terminal of the diplexer, an LPF of the DCS side connected to another terminal are respectively formed as chip parts stacked in a multi-layer ceramic substrate. The three chip parts, a radio frequency switch connected to the LPF of the GSM side, and a radio frequency switch connected to the LPF of the DCS side are mounted on a resin multilayer substrate.

SUMMARY OF THE INVENTION

FIG. 15 shows a circuit configuration of general cellular phones. A circuit of cellular phones is broadly divided into a radio frequency circuit part (RF part) that handles high frequency signals, that is, radio frequency (hereinafter referred to as RF) signals, and a base-band (hereinafter referred to as BB) part that handles digital signals. In FIG. 15, an RF part 2 is connected to an antenna 1 that transmits and receives radio waves, a crystal unit (hereinafter referred to as Xtal) as a reference frequency source, and further a base-band large scale integrated circuit 4 (hereinafter referred to as BB-LSI) The BB-LSI 4 is connected to a microphone, a speaker, an application processor, and the like. The application processor is connected to a keypad (Key), a liquid crystal display (LCD), a camera, a static random access memory (SRAM), a nonvolatile memory (NVM), and the like. Transmission/reception operations in a cellular phone are performed as briefed below.

First, during transmission, voice inputted from a microphone is encoded and modulated by the BB-LSI 4 into a BB transmission signal. The BB transmission signal is sent to the RF part 2, where it is converted into an RF transmission signal, which is radiated from the antenna 1. As described later, in the RF part 2, a frequency of the BB transmission signal is converted by a transmitter into another frequency of an RF transmission signal. Then, the RF transmission signal is amplified by a power amplifier (hereinafter referred to as PA), and radiated from the antenna 1 after unwanted harmonics are removed by a transmission filter.

Next, during reception, an RF received signal received by the antenna 1 is sent to the RF part 2, where it is converted into a BB received signal, which is sent to the BB-LSI 4. The BB received signal is outputted from the speaker after being demodulated and decoded. As described later, in the RF part 2, the RF received signal is cleared of an unwanted signal by a reception filter, amplified by a low noise amplifier (hereinafter referred to as LNA), and a frequency of the RF received signal is converted into a frequency of a BB received signal by a receiver.

Here, for the frequency conversion by the transmitter and the receiver, a local oscillation signal having a specific frequency generated by a voltage control oscillator (hereinafter referred to as VCO) is used. The VCO sets the frequency of the local oscillation signal by using a reference frequency signal generated by the Xtal.

For cellular phones, depending on regions, various communication systems are adopted, and frequency bands used also differ. Presently, dominant communication systems are the above-described GSM, which is primarily adopted in Europe, and W-CDMA (Wide-band-CDMA), which is primarily adopted in the US and Japan. In transmission/reception operations within a cellular phone, a system called Time Division Duplex (TDD) in which transmission and reception are alternately performed is adopted in GSM, while in W-CDMA, a system called Frequency Division Duplex (FDD) in which transmission and reception are performed at the same time is adopted.

Recently, in order that cellular phones can be used over multiple regions, multiband/multi-mode cellular phones that accommodate multiple frequency bands and communication systems are being realized. FIG. 16 shows a circuit configuration of a radio frequency circuit for multi-mode operation with the two systems integrated. Hereinafter, GSM will be represented as "G-," and W-CDMA as "W-."

In FIG. 16, a W-RF circuit comprises a W-transmitter (Tx) 130, a W-inter stage filter 125 being a bandpass filter (hereinafter referred to as BPF), W-PA 121, an isolator 115, a duplexer (Dup) 100, and a W-receiver (Rx) 150. The W-transmitter 130 converts a frequency of a BB transmission signal into a frequency of an RF transmission signal. The W-inter-stage filter 125 removes an unwanted frequency component from the RF transmission signal generated by the W-transmitter 130. The W-PA 121 that amplifies the RF transmission signal is generally organized into a module together with a matching network and the like, and often used in the form of a W-power amplifier module 120 (hereinafter referred to as PAM (PA Module)). The isolator 115, which is a circuit that allows signals to pass only in one direction, prevents the PA from being destroyed because transmission power returns to the PA when a load of the antenna side fluctuates. The duplexer 100 distributes signals having different frequencies to two paths, respectively, and for a W-RF transmission signal and a W-RF received signal having frequencies different form each other, sends the RF transmission signal only from the transmitter to the antenna, and sends the RF received signal only from the antenna to the receiver. The duplexer has a function for removing an unwanted frequency component from an RF transmission signal amplified by the PA, and a function for removing an unwanted frequency component from a signal antenna received by the antenna. The W-receiver 150 includes an LNA, which amplifies a received RF signal and further converts a frequency of it into a frequency of a BB received signal.

A G-RF circuit comprises a G-transmitter 230, G-PAs 221, G-transmission filters 210 each being an LPF, a switch (SW) 90, G-reception filters 240 each being a BPF, and G-receiver 250. In this example, GSM has a quad-band configuration accommodating four frequency bands. The G-transmitter 230 converts a frequency of the BB transmission signal into a frequency of an RF transmission signal. In GSM, by using in a transmitter a circuit type such as an offset PLL (Phase Lock Loop) circuit that suppresses the occurrence of unwanted frequency components, an inter stage filter such as W-CDMA often becomes unnecessary. The G-PAs 221 that amplify an RF transmission signal are respectively provided for two frequency bands, and they each are organized into a module together with an output matching network and the like as in the case of W-CDMA, and often are used in the form of G-PAM 220. In GSM, by using a device having an improved breakdown voltage for a PA, no isolator is often required. The G-transmission filters have a function for removing unwanted frequency components from the RF transmission signal amplified by the PA. In this example, two G-PAs are respectively provided for two frequency bands. The G-reception filters 240, which are respectively provided for four frequency bands, send a signal received by the antenna to the G-receiver 250 after removing unwanted frequency components from it. The G-receiver 250, which includes an LNA, amplifies the received RF signal and further converts a frequency of the amplified signal into a frequency of a BB received signal.

Since the TDD system is adopted in GSM, only a transmission system operates during transmission, and only a reception system operates during reception. Accordingly, by connecting, by the switch 90, the antenna and a transmission system of a required frequency band during transmission, and the antenna and a reception system of a required frequency band during reception, the same antenna is shared between transmission and reception. Furthermore, in this example, since the antenna 1 and the duplexer 100 are connected by the switch 90, the same antenna can be shared between GSM and W-CDMA. A circuit produced by organizing the switch 90, the transmission filters 210, and the reception filters 240 into a module is a front end module (FEM) 200.

With reference to FIG. 17, a description will be made of a conventional technique for realizing an RF circuit for multi-mode operation on a cellular phone. FIG. 17 shows a layout of a mother board 5 on which a conventional RF circuit for multi-mode operation, installed in a cellular phone, is mounted. The RF circuit and Xtal 3 described in FIG. 16 are disposed on the mother board 5 of the cellular phone, and an antenna terminal of FEM 200 is electrically connected with an antenna terminal 6 on the mother board. An antenna (not shown) is connected with the antenna terminal 6 so that signals are transferred between the RF circuit and the antenna.

Sensitivity deteriorates when harmonics of a digital signal generated by a BB part (not shown) interferes with receive circuits in the RF circuit. When an unwanted signal other than transmission signals generated in transmit circuits in the RF circuit radiates from lines and the like, the radiating unwanted signal may cause the BB part and other devices to malfunction. Therefore, the whole of the RF part is generally shielded to prevent noise interference with the RF part and noise radiation from the RF part. Furthermore, in the RF circuit for multi-mode operation, generally, a shield is provided between circuits to prevent the circuits from exerting an influence on each other. Particularly, in the RF circuit for W-CDMA of the FDD system in which transmit circuits and receive circuits operate at the same time, when a transmission frequency signal being a main component of an RF transmission signal flows into the receive circuits, sensitivity decreases because the LNA saturates, and when a reception frequency band noise in an RF transmission signal flows into the receive circuits, a signal to noise ratio decreases and sensitivity decreases. Therefore, to prevent the output of the transmit circuits from influencing the receive circuits via space, a shield is provided between the transmit circuits and the receive circuits. As another countermeasure, in the RF part, a shield is provided to separate the power amplifier from the transmitters to prevent the output of the power amplifier from being fed back to the transmitters and oscillating.

In an example of a conventional RF circuit for multi-mode operation shown in FIG. 17, a group of FEM 200 and G-PAM 220, a G-radio frequency integrated circuit (hereinafter referred to as RF-IC) 300 on which GSM transceivers are integrated, a duplexer 100 for W-CDMA, a group of isolator 115 and W-PAM 120, a group of W-inter stage filter and W-RF-IC 130 being a W-transmitter (Tx) put into an integrated circuit, W-RF-IC 150 being a W-receiver (Rx) put into an integrated circuit, and Xtal 3 are separated from each other by a shield 7 (indicated by a dotted line) and shielded from the external circuits.

The conventional RF circuit for multi-mode operation has an advantage that each of circuits separated by the shield operates without signal interference from other circuits. However, it has a problem that the area of the whole RF part becomes large because of shield thickness and a margin for alignment required to avoid contact between the shield and the circuits within the shield. Furthermore, since a filter used in the RF part, as typified by a surface acoustic wave filter, changes in frequency characteristics with changes in temperature, it must be placed apart from the PA that consumes the largest power in the cellular phone and is the largest heat generation source. This is also a factor of increasing the area of the RF part.

Since the techniques described in the patent documents 1 and 2 do not take the problem of signal interference between circuits into account, miniaturizing the modules by narrowing the intervals between parts would inevitably increase signal interference between the circuits and deteriorate performance.

An object of the present invention is to provide a RF circuit for multi-mode operation that suppresses signal interference between circuits and is miniaturized.

One typical example of the present invention for achieving the above-described object is described below. The RF circuit for multi-mode operation of the present invention, which complies with multiple communication systems, comprises a first circuit that handles RF transmission signals of a first communication system included in the multiple communication systems, and a second circuit that handles RF received signals of the first communication system, wherein, when the RF circuit for multi-mode operation is mounted on a substrate, a third circuit independent of the circuit operation of the first communication system is disposed in a section of the shortest distance between the first circuit and the second circuit. Since such a sufficient distance as not to cause signal interference between the first circuit and the second circuit is provided, and a third circuit independent of the operation of the first and second circuits is disposed between them, the substrate can be effectively utilized with signal interference suppressed between the circuits, and it is expected that a miniaturized RF circuit for multi-mode operation can be realized. Usually, since any portion of the third circuit is grounded, the third circuit is close to a grounded conductor when viewed from the first and second circuits, and shielding between the first and second circuits becomes more effective. The present invention is particularly effective when the first communication system is the frequency division duplex system in which transmission and reception can be performed at the same time.

Another typical example of the present invention for achieving the above-described object is described below. The RF circuit for multi-mode operation of the present invention, which complies with multiple communication systems, comprises a transmitter that outputs RF transmission signals of a first communication system included in the multiple communication systems, and a power amplifier that amplifies RF transmission signals outputted by the transmitter, wherein, when the RF circuit for multi-mode operation is mounted on a substrate, a seventh circuit independent of the circuit operation of the first communication system is disposed in a section of the shortest distance between the transmitter and the power amplifier. Since such a sufficient distance as not to cause signal interference between the power amplifier and the transmitter is provided, and a seventh circuit independent of the operation of the power amplifier and the transmitter is disposed between them, the substrate can be effectively utilized with signal interference suppressed between the circuits, and it is expected that a miniaturized RF circuit for multi-mode operation can be realized. Thereby, possible oscillation between the power amplifier and the transmitter can be avoided. It is desirable that an eighth circuit independent of the circuit operation of the first communication system is disposed between a section of the shortest distance between a first filter that limits the low frequency range of a RF transmission signal outputted by the transmitter, and the power amplifier. Since the eighth circuit blocks heat transfer from the power amplifier to the first filter, a temperature rise of the first filter due to heat generated by the power amplifier is curbed, so that the performance of the first filter can be maintained.

According to the present invention, a compact RF circuit for multi-mode operation with signal interference suppressed between circuits can be realized.

These and other objects and many of the attendant advantages of the invention will be readily appreciated as the same becomes better understood by reference to the following detailed description when considered in connection with the accompanying drawings.

DETAILED DESCRIPTION OF THE REFERRED EMBODIMENTS

Figure 1A:
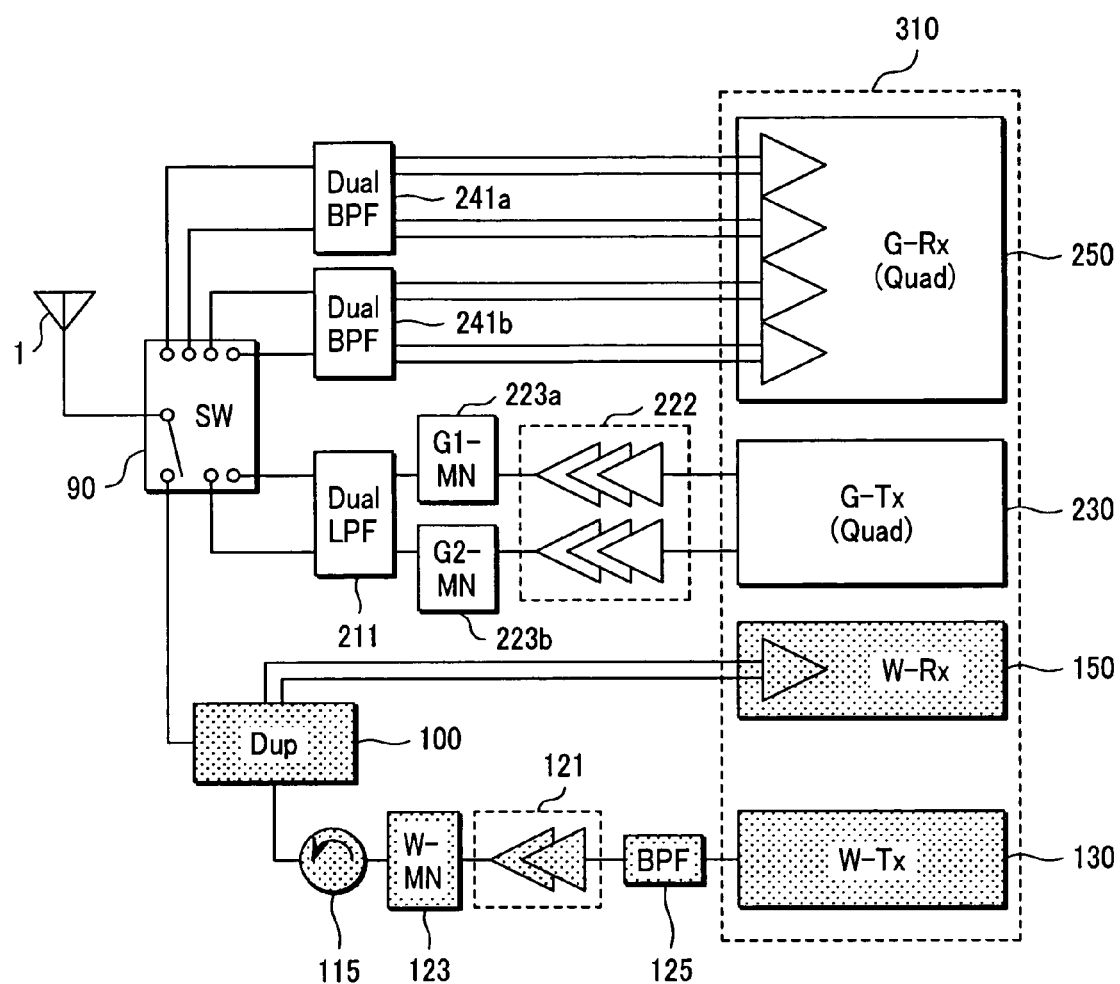
FIG. 1A is a block diagram for explaining a first embodiment of an RF circuit for multi-mode operation according to the present invention.

Hereinafter, an RF circuit for multi-mode operation according to the present invention will be described in more detail with reference to some embodiments shown in the drawings. In all drawings for explaining the embodiments, members having an identical or similar function are identified by the same reference numerals, and duplicate descriptions of them will be omitted.

<First Embodiment>

Figure 1B:
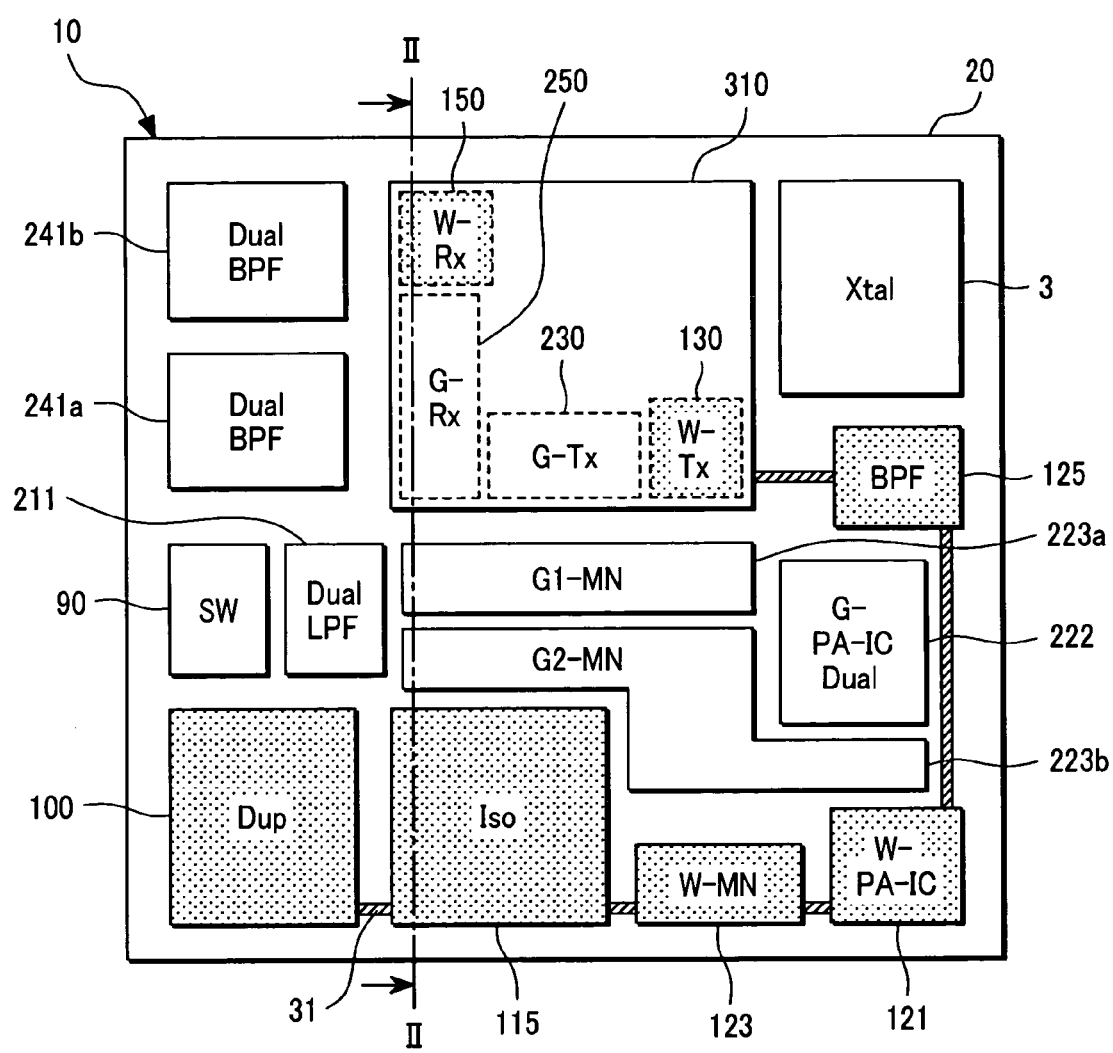
FIG. 1B is a layout diagram for explaining an RF circuit module provided with an RF circuit for multi-mode operation according to the first embodiment of the present invention.
Figure 2:
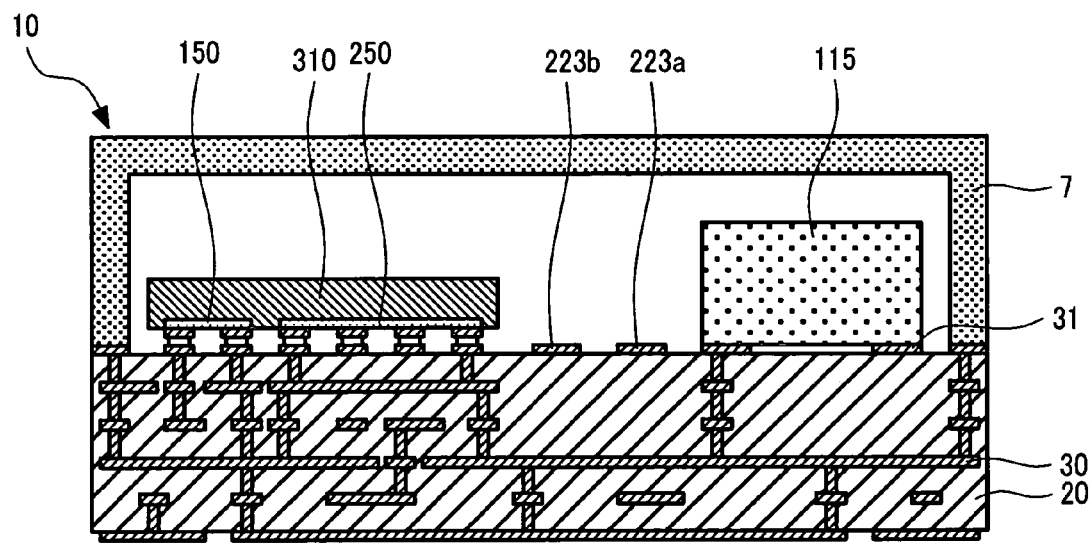
FIG. 2 is a sectional view of the RF circuit module of FIG. 1B taken along the line II-II.

FIGS. 1A, 1B, and 2 show a first embodiment of the present invention. An RF circuit for multi-mode operation of this embodiment is constructed as an RF circuit module mounted on a module substrate. FIG. 1A is a block diagram of an RF circuit for multi-mode operation, FIG. 1B is a layout chart of the RF circuit module, and FIG. 2 is a sectional view of the RF circuit module taken along the line II-II. A first communication system in this embodiment is W-CDMA, and a second communication system is GSM. GSM is divided into GSM1 (G1) and GSM2 (G2) by frequency bands.

In FIG. 1A, a W-RF circuit comprises a transmitter (W-Tx) 130, W-inter stage filter (BPF) 125, W-PA 121, W-output matching network (W-MN) 123, an isolator 115, a duplexer (Dup) 100, and a W-receiver (W-Rx) 150. A G-RF circuit comprises a G-transmitter 230, a G-PA 222, a G1-output matching network (G1-MN) 223a, a G2-output matching network (G2-MN) 223b, a G-transmission filter (DualLPF) 211, a Switch (SW) 90, a G-reception filter (DualBPF) 241a, a G-reception filter (DualBPF) 241b, and G-receiver 250. In this embodiment, GSM has a Quad band structure accommodating four frequency bands.

Figure 16:
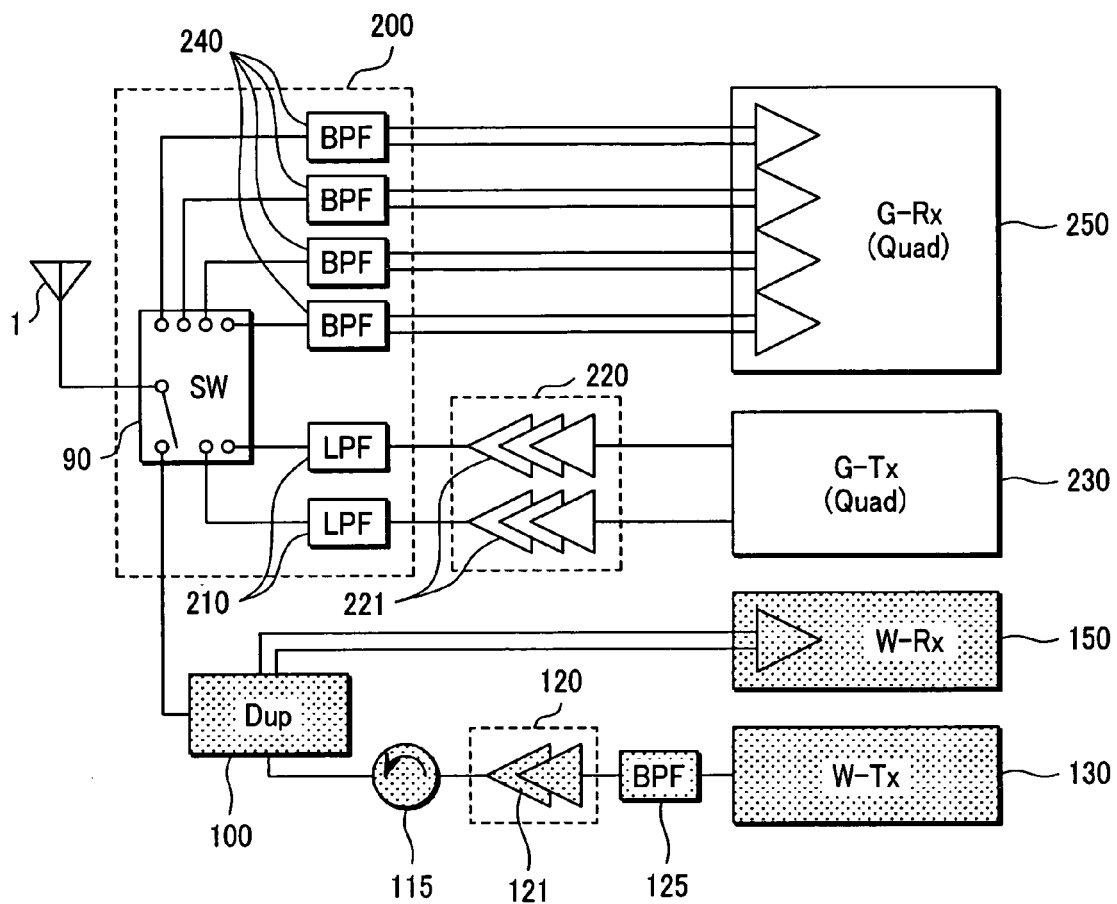
FIG. 16 is a block diagram for explaining an RF circuit for multi-mode operation of a common cellular phone.
Figure 17:
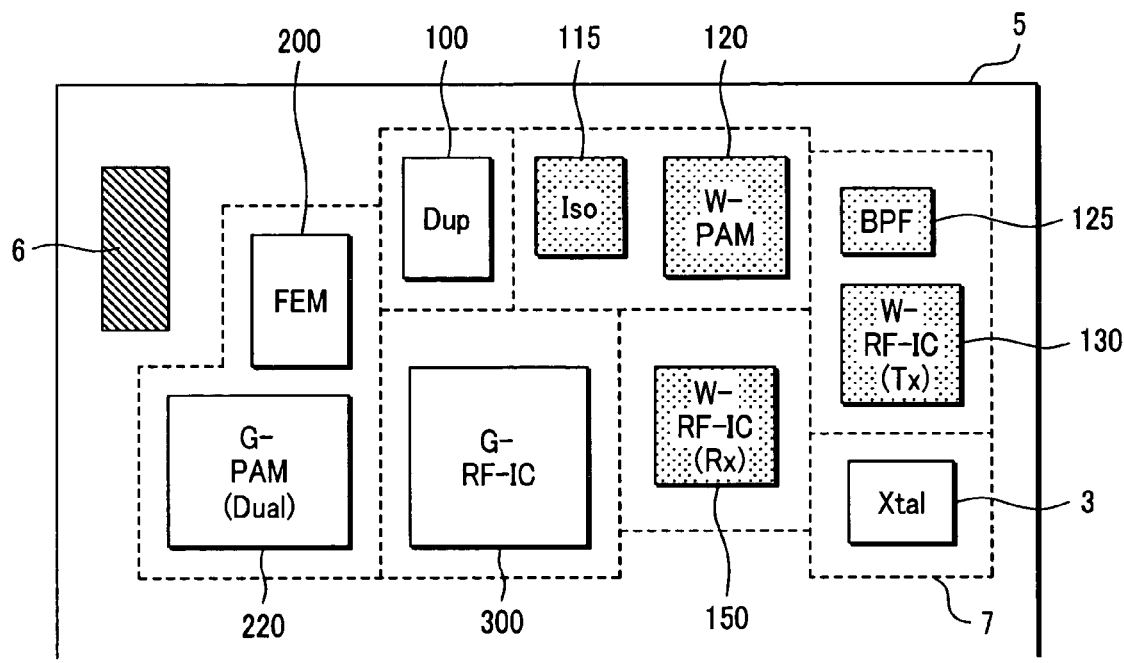
FIG. 17 is a layout diagram for explaining a conventional example of a mother board on which the RF circuit for multi-mode operation in FIG. 16 is mounted.

As described above, although the RF circuit for multi-mode operation of this embodiment has many similarities to the RF circuit for multi-mode operation shown in FIG. 16, differences will be briefly described. There are three differences. First, a front end part of GSM, in place of an FEM, comprises a switch (SW) 90 by SP7T (Single Pole 7 Throw), a G-dual band transmission filter (Dual LPF) 211 in which transmission filters are grouped into two systems, and a G-dual band reception filter (Dual BPF) 241a and a G-dual band reception filter (Dual BPF) 241b in which reception filters are grouped for two frequency bands.

Second, a transmission power amplifying part of GSM and W-CDMA, in place of PAM, comprises a G-dual band PA-IC (G-PA-ICDual) 222, a G1-output matching network (G1-MN) 223a, and a G2-output matching network (G2-MN) 223b on the part of GSM, while on the part of W-CDMA, comprises W-PA-IC 121 and a W-output matching network (W-MN) 123.

Third, the W-transmitter (Tx) 130, the W-receiver (W-Rx) 150, the G-M transmitter (G-Tx) 230, and the G-receiver (G-Rx) 250 are integrated on a multi-mode RF-IC 310.

These circuits are placed on a module substrate 20 as shown in FIG. 1B, and an RF circuit for multi-mode operation module 10 is formed. Although the module substrate 20 is a glass-ceramic multi-layer substrate, a glass-epoxy substrate may be used. As shown in FIG. 2, a grounded conductor 30 is provided in the module substrate 20, and a shield 7 mounted to cover the RF circuit is connected to the grounded conductor 30 through via holes provided in the module substrate 20. The grounded conductor 30 is further connected to a ground terminal on the back surface of the module substrate through other via holes.

In FIG. 1B, an RF transmission signal of the W-CDMA amplified by the W-PA 121 is conveyed to the duplexer (Dup) 100 via the W-output matching network 123, the isolator (Iso) 115, and a first line 31. The G-PA 222, the G1-output matching network 223a, and the G2-output matching network 223b which is a circuit (third circuit) independent of the circuit operation of the W-CDMA are placed in a section of the shortest distance between a circuit (first circuit) from the W-PA 121 to the first line 31 and the W-receiver 150 (second circuit) on the multi-mode RF-1C 310. The G-PA 222, the G1-output matching network 223a and the G2-output matching network 223b, each of which is a circuit (seventh circuit) independent of the circuit operation of the W-CDMA are placed in a section of the shortest distance between a circuit from the W-PA 121 to the first line 31 and the W-transmitter 130 on the multi-mode RF-1C 310. The G-PA 222 and the G2-output matching network 223b, each of which is a circuit (eighth circuit) independent of the circuit operation of the W-CDMA are placed in a section of the shortest distance between the W-PA 121 and W-inter stage filter 125 (first filter).

According to the construction described above, in the RF circuit for W-CDMA of the FDD system in which transmission and reception operate at the same time, the W-CDMA transceiver has been maintained to have high performance by providing such a sufficient distance as not to cause signal interference between a circuit from the W-PA 121 that handles RF transmission signals of maximum power to the first line 31, and the W-receiver 150 that handles RF received signals of minute amplitude. Furthermore, by placing in the distance portion the G-PA 222, and the G1 and G2-output matching networks 223a and 223b which are independent of W-CDMA operation, the area of the module substrate 20 is efficiently utilized, and significant miniaturization has been achieved in comparison with the case where the present invention is not applied. Since the G-PA 222, and the G1 and G2-output matching networks 223a and 223b which are independent of W-CDMA operation have grounded portions, they are close to grounded conductors, so that signal interference is suppressed more effectively.

According to the present embodiment, since signal interference from the W-PA 121 to the W-transmitter 130 is suppressed, the transmit circuits do not oscillate. Furthermore, since thermal conduction between the W-PA 121 and the W-inter stage filter 125 is small, the W-inter stage filter 125 can avoid deteriorating in frequency characteristic due to a rise in temperature. As a result, according to this embodiment, without causing signal interference and thermal interference between circuits, the RF circuit for multi-mode operation module in which multiple transceivers complying with multiple communication systems are placed can be miniaturized while maintaining high performance. Since cellular phones using the RF circuit module of this embodiment have a small-sized RF part having high performance, the size of the cellular phones themselves can be made smaller.

Since other cellular phones using the RF circuit module of this embodiment have a small-sized RF part having high performance, other circuits such as micro hard disk drivers can be added to a free space on a mother board.

In any of the cases, since the RF circuit module of this embodiment has all functions of the RF part and yet is wholly shielded, signal interference does not occur between the RF part and the BB part disposed near it, packaging density on the mother board can be increased.

In this embodiment, although switching between GSM and W-CDMA is made by a switch, in the case of a cellular phone having the respective antennas of GSM and W-CDMA, the switch may be connected to the GSM antenna and the duplexer may be connected to the W-CDMA antenna. In this case, an SP6T switch having a simpler structure than the SP7T switch can be used, and yet loss between the RF circuit for W-CDMA and the antenna can be reduced. Instead of using the SP7T switch, a diplexer that distributes signals of low frequencies and signals of high frequencies to different systems, and SP3T and SP4T switches may be used in combination. In any constructions, the same effects as this embodiment can be obtained by applying the present invention.

Figure 3A:
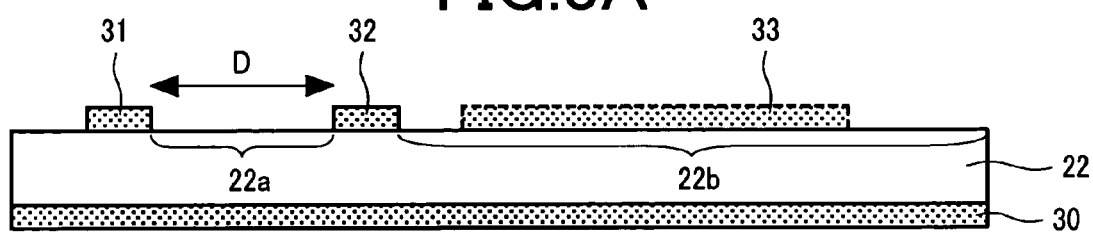
FIG. 3A is a first sectional view for comparing the effects of the RF circuit for multi-mode operation of the present invention.
Figure 3B:
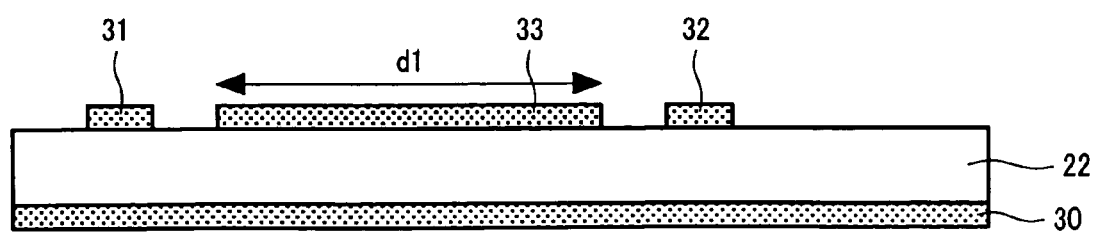
FIG. 3B is a second sectional view for comparing the effects of the RF circuit for multi-mode operation of the present invention.
Figure 3C:
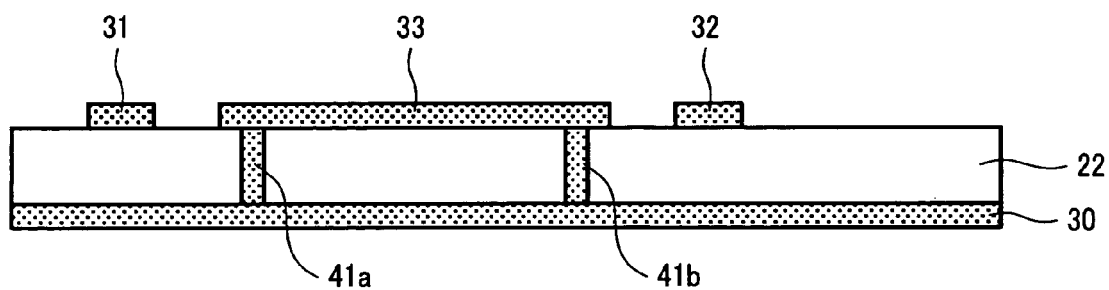
FIG. 3C is a third sectional view for comparing the effects of the RF circuit for multi-mode operation of the present invention.
Figure 3D:
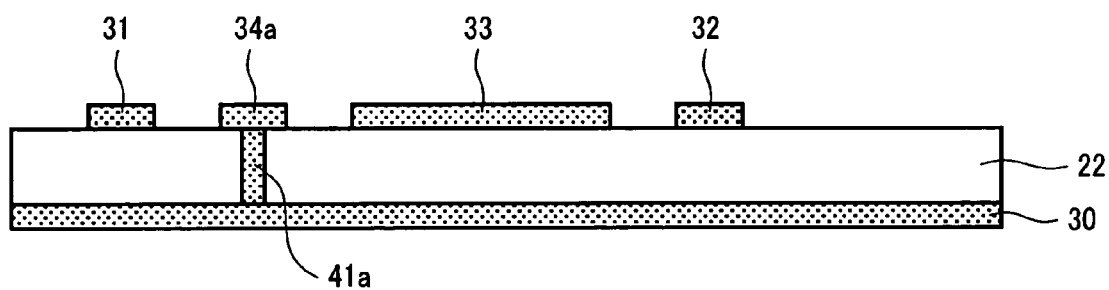
FIG. 3D is a fourth sectional view for comparing the effects of the RF circuit for multi-mode operation of the present invention.
Figure 3E:
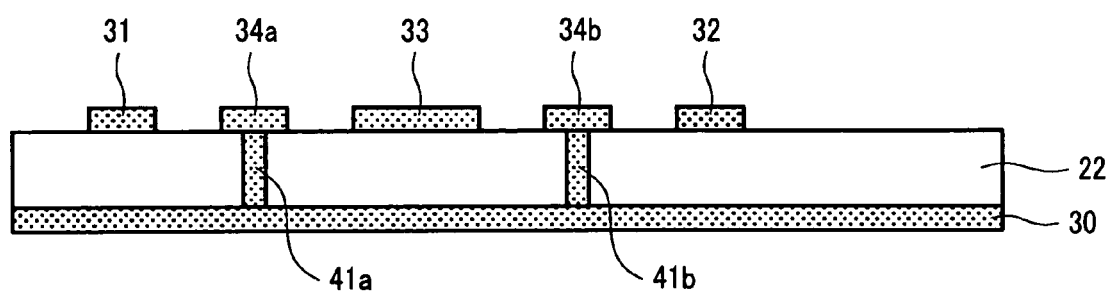
FIG. 3E is a fifth sectional view for comparing the effects of the RF circuit for multi-mode operation of the present invention.

Here, effects of the present invention are described using of five types of substrates as examples. FIGS. 3A to 3E are sectional views of the substrates, wherein FIG. 3A shows a case where lines 31 and 32 are formed adjacently to each other on the substrate 22, FIG. 3B shows a case where an isolating conductor 33 is sandwiched between the lines 31 and 32, FIG. 3C shows a case where the grounded conductor 33 is sandwiched, FIG. 3D shows a case where an isolating conductor 33 with a grounded conductor 34a provided in one side is sandwiched, and FIG. 3E shows a case where an isolating conductor 33 with grounded conductors 34a and 34b provided in both sides is sandwiched.

The substrate 22 is a glass-ceramic substrate having a relative permittivity of 7.8, tan δ of 0.002, and a thickness of 400 μm. A grounded conductor 30 is provided on the back surface of the substrate 22. The first line 31 and the second line 32 are provided on the surface of the substrate 22 at an interval of D. The width of the first line 31 and the second line 32 is 300 μm. The electrical conductivity of the line conductor is $4\times10^7$ S/m and its thickness is 10 μm. When only conductor pattern 33 is provided between the first line 31 and the second line 32, the conductor pattern 33 becomes an isolating conductor that is unstable in potential. When the conductor pattern 33 is connected to the grounded conductor 30 by via holes 41a and 41b, the conductor pattern 33 becomes a grounded conductor. Furthermore, when conductor patterns 34a and 34b are provided and connected to the grounded conductor 30 by the via holes 41a and 41b, and the conductor pattern 33 is provided between the conductor patterns 34a and 34b, the conductor pattern 33 becomes an isolating conductor sandwiched between the grounded conductors. When the conductor pattern 34a is provided and connected to the grounded conductor 30 by the via hole 41a, and the conductor patter 33 is provided between the conductor patterns 34a and the second line 32, the conductor pattern 33 becomes an isolating conductor with a grounded conductor provided at one side. The interval between the conductor pattern 33 and the first line 31, and the interval between the conductor pattern 33 and the second line 32 are 100 μm, respectively. The widths of the conductor patterns 34a and 34b are 200 μm, respectively. The interval between the conductor pattern 34a and the first line 31, the interval between the conductor pattern 34b and the second line 32, and the respective spaces between the conductor pattern 33 and the conductor patterns 34a and between the conductor pattern 33 and the conductor pattern 34b are set to 100 μm.

Figure 4:
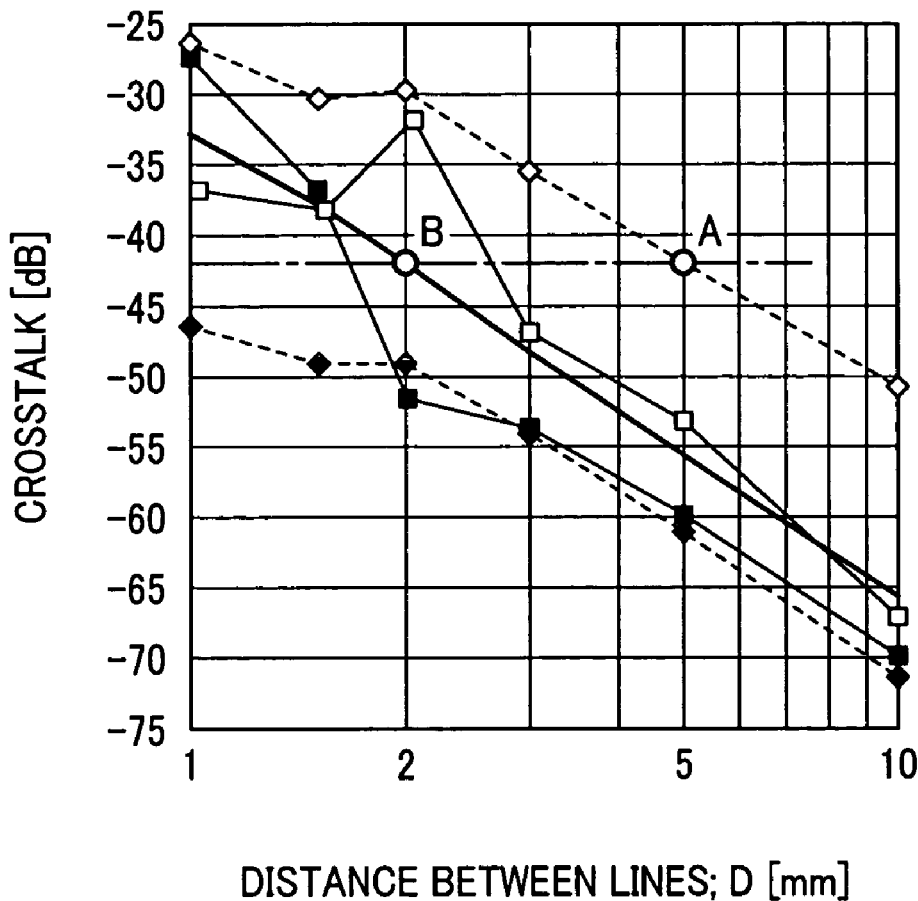
FIG. 4 is a drawing for explaining a result of comparing the effects of the RF circuit for multi-mode operation of the present invention.

The effect of reduction in interference is represented by the quantity of crosstalk. FIG. 4 is a graph showing a relationship between the distance D [mm] between the first line 31 and the second line 32 when lines constructed as shown in FIGS. 3A to 3E are provided over a length of 5 mm, and crosstalk [dB], obtained by an electromagnetic analysis. Crosstalk values shown in the graph are maximum values of crosstalk appearing in an end, nearest to a signal input end of the first line 31, of the second line 32 from a signal input end of the first line 31 (so-called near-end crosstalk), in a W-CDMA reception frequency band of 2.11 to 2.17 GHz. As shown in FIG. 4, when an isolating conductor exists, crosstalk becomes greater than that when only the lines exist, in the same inter-line distance. This is because the first line 31 and the second line 32 cause capacitive coupling via the conductor pattern 33 that functions as an isolating conductor. In contrast to this, when the conductor pattern 33 is used as a grounded conductor, the grounded conductor functions as shielding, and crosstalk becomes smaller than that when only the lines exist. When an isolating conductor including grounded conductors at both sides exists, for an inter-line distance of 2 mm or longer, crosstalk almost equal to that when only grounded conductors exist is obtained. When an isolating conductor including a grounded conductor at one side exists, for an inter-line distance of 3 mm or longer, crosstalk close to that when only lines exist is obtained.

Substrate cross sections as shown in FIGS. 3A to 3E correspond to those of RF circuit module substrates and the mother boards of cellular phones. When the first line is used as a circuit handling RF transmission signals of W-CDMA, and the second line is used as a circuit handling RF received signals of W-CDMA, conventionally, to prevent signal interference between the both, generally, a construction shown in FIG. 3A has been taken to widen the distance between the lines, or a construction shown in FIG. 3C has been taken to provide a grounded conductor between the lines. In the case of FIG. 3C, circuits independent of the circuit operation of W-CDMA must be disposed outside the lines, so that an increase in substrate area is unavoidable.

In contrast to this, in this embodiment, a circuit independent of the circuit operation of W-CDMA is provided between the first line 31 and the second line 32. It is assumed that two W-CDMA circuits correspond to the first line 31 and the second line 32, respectively, a circuit independent of the circuit operation of W-CDMA corresponds to the conductor pattern 33, and the conductor pattern 33 is an isolating conductor. In a construction shown in FIG. 3B, when interference between the first line 31 and the second line 32 is set below −40 dB, it will be understood from the point A of FIG. 4 that a value of 5 mm is sufficient as the inter-line distance D. The conductor pattern 33 which is 4 mm in width d1 can be disposed in an area 22a between the lines, which is an inter-line distance of 5 mm. On the other hand, in a construction shown in FIG. 3A, when interference between the first line 31 and the second line 32 is set below −40 dB, it will be understood from the point B of FIG. 4 that the inter-line distance D requires 2 mm. Furthermore, in the construction shown in FIG. 3A, the conductor pattern 33 must be disposed in a place other than the inter-line area 22a, for example, an area on the substrate 22 indicated by 22b of FIG. 3A, and if the width d1 of the conductor pattern 33 is 4 mm, including a space provide to avoid contact between the conductor pattern 33 and the first line 31 or the second line 32, a width of at least 6 mm is required in an inter-line direction. Here, the inter-line direction is a direction parallel to the inter-line distance D, and d1 is the width of the conductor pattern in the inter-line direction. Thus, when the conductor pattern 33 has the large width of 4 mm, the construction shown in FIG. 3B in which the conductor pattern 33 is disposed between the first line 31 and the second line 32 can make substrate width in the inter-line direction smaller than the construction shown in FIG. 3A. In other words, when a circuit independent of the circuit operation of W-CDMA is sufficiently large, that is, when the width of the conductor pattern 33 can be taken to be sufficiently wide, when signal interference between the first line 31 and the second line 32 does not need to be sufficiently reduced, or when a line length is short, by providing only an isolating conductor between the first line 31 and the second line 32, an area on the substrate can be effectively utilized.

When the width d1 of the conductor pattern 33 being an isolating conductor is narrow, or when signal interference between the first line 31 and the second line 32 must be sufficiently reduced, the constructions shown in FIGS. 3D and 3E are preferable. If the grounded conductor 34a is provided between the first line 31 and the conductor pattern 33 being an isolating conductor, crosstalk almost equal to that when only lines exist can be achieved in an inter-line distance of 3 mm or longer, and at the same time an area on the substrate can be effectively utilized. Furthermore, if the conductor pattern 33 being an isolating conductor with the grounded conductors 34a and 34b provided at both sides is provided between the first line 31 and the second line 32, crosstalk almost equal to that when a grounded conductor exists between the lines can be achieved in an inter-line distance of 2 mm or longer, and at the same time an area on the substrate can be effectively utilized.

The above description assumes that the conductor pattern 33 is an isolating conductor. However, generally, since a circuit independent of the circuit operation of W-CDMA that corresponds to the conductor pattern 33 has a grounding portion, the circuit is close to a grounded conductor, and a higher interference reduction effect is obtained in the construction shown in FIG. 3B, so that a more effective use of substrate area is promoted. The constructions shown in FIGS. 3D and 3E correspond to examples described later using FIGS. 8B and 9. A relationship of crosstalk quantities between the constructions shown in FIGS. 3D and 3E and the constructions shown in FIGS. 3A and 3C depends on the permittivity, thickness, and line of the substrate. Therefore, the numeric values of the inter-line distance and the like described in this embodiment are only examples, and do not limit the scope of the present invention.

With regard to the multi-mode RF-IC 310, the W-transmitter 130 (first transmitter) and W-receiver 150 (first receiver) are respectively disposed at both corners on a diagonal line of the multi-mode RF-IC 310 chip. Furthermore, in a section of the shortest distance of the both, the GSM transmitter 230, which is a circuit (eleventh circuit) independent of the circuit operation of W-CDMA, and other circuits not shown in the drawing are disposed. By this construction, the longest distance that is possible on the chip of the multi-mode RF-IC 310 is realized between the W-transmitter 130 and the W-receiver 150, and with the largest possible reduction in signal interference and high performance, circuits not influencing W-operation are provided in a free space to effectively utilize the chip area, so that the multi-mode RF-IC on which the RF circuit for multi-mode operation is integrated can be reduced in size.

Figure 5:
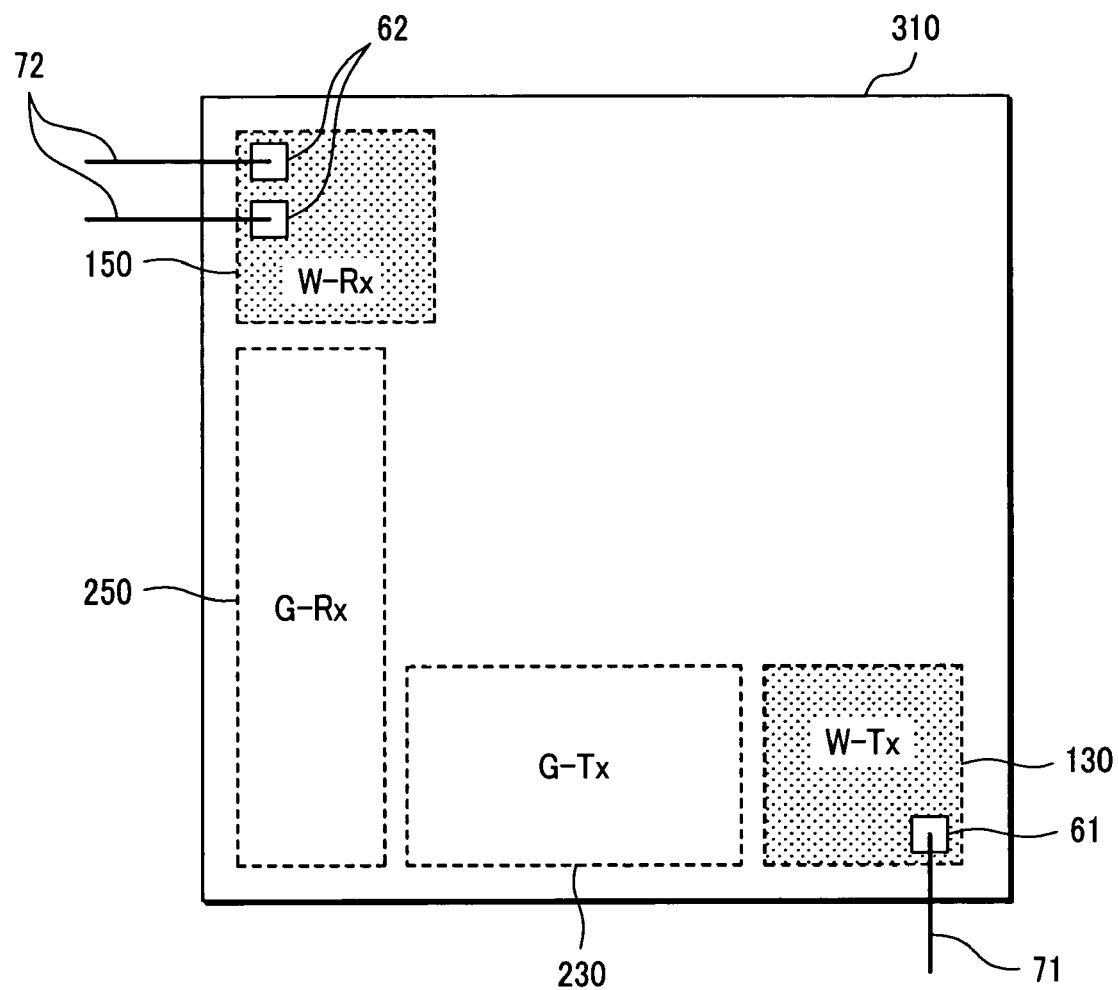
FIG. 5 is another layout diagram for explaining the first embodiment of the present invention.

When it is assumed that the multi-mode RF-IC of this embodiment is mounted faceup on a substrate of a device in which it is used, as shown in FIG. 5, an output pad 61 is provided on the W-transmitter 130 and input pads 62 are provided on the W-receiver 150. The output pad 61 and a line on a substrate on which the multi-mode RF-IC 310 is mounted are wire-bonded to each other by an output wire 71, and the input pads 62 and another line on a substrate on which the multi-mode RF-IC 310 is mounted are wire-bonded to each other by an input wire 72. Since the output wire 71 and the input wire 72 are provided in a direction orthogonal to each other, the magnetic coupling between the both wires can be reduced. Therefore, when the multi-mode RF-IC 310 is mounted on the substrate and actually used, there was no increase in signal leak from the transmit circuits to the receive circuits. In this embodiment, bonding wires are used for connection between the output pad 61 and the input pads 62, and the lines on the substrate on which the multi-mode RF-IC 310 is mounted. However, the same effect will also be obtained in a construction in which the pads on the chip and lines on a flexible printed board are connected by the lines provided on the board.

<Second Embodiment>

Figure 6:
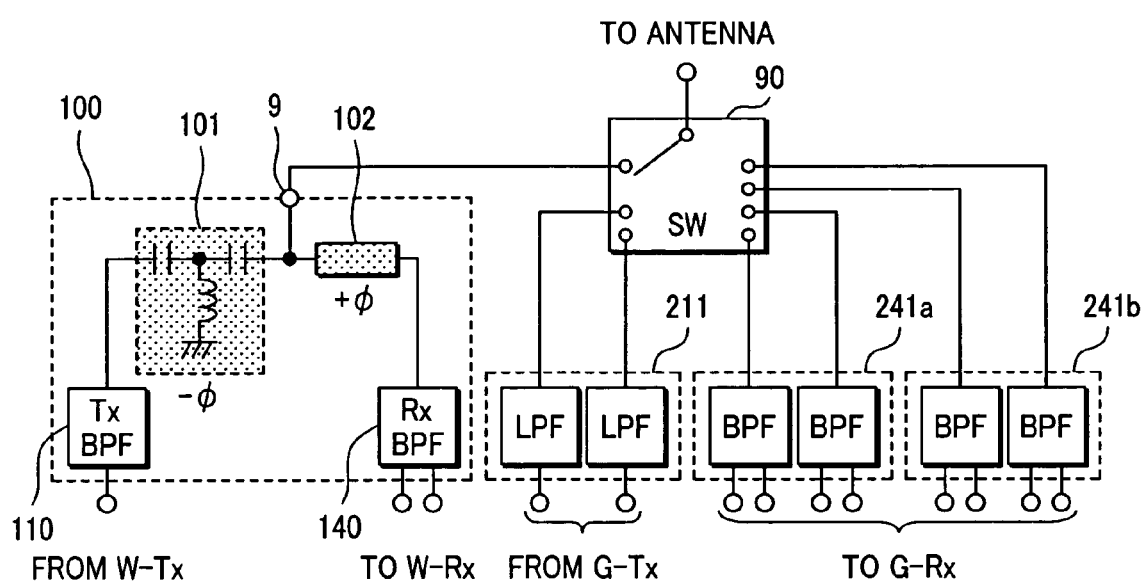
FIG. 6 is a block diagram of a front end module for explaining a second embodiment of the present invention.
Figure 7A:
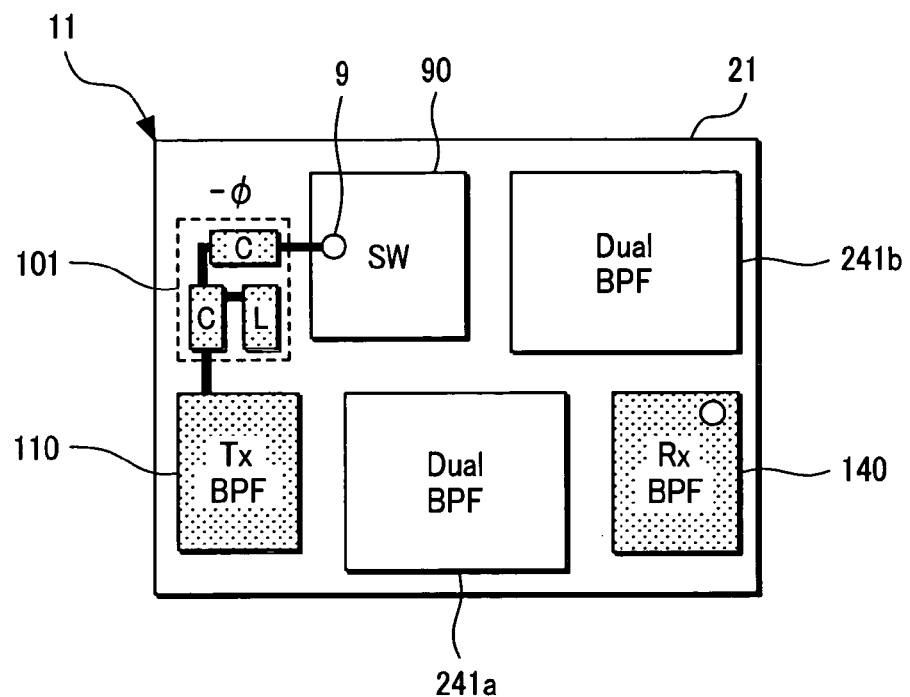
FIG. 7A is a layout diagram for explaining a front end module of the second embodiment.
Figure 7B:
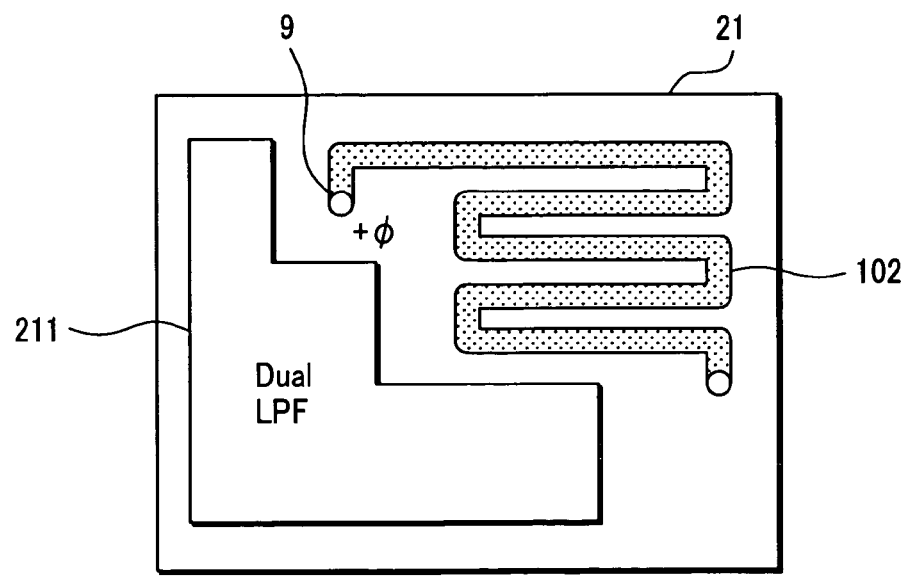
FIG. 7B is a pattern diagram for explaining the front end module of the second embodiment.

FIG. 6 and FIGS. 7A and 7B show a second embodiment of the present invention. The RF circuit for multi-mode operation of this embodiment is a circuit produced by organizing the front end part including the duplexer 100 in the first embodiment, that is, the multi-mode front end part into a module for the purpose of reducing interference. FIG. 6 is a circuit diagram of the module. FIGS. 7A and 7B are a layout diagram and an internal layer pattern diagram of the multi-mode FEM 11, respectively.

The duplexer 100 includes a W-transmission filter (Tx BPF) 110, W-reception filter (Rx BPF) 140, a phase shifter (−Φ) 101, and a transmission line for phase shift (+Φ) 102. The phase shifter 101, as shown in FIG. 6, is composed of two capacitors C connected in series and an inductor connected between ground and the connection point of the capacitors. Although both the W-transmission filter 110 and the W-reception filter 140 are BPF, a combination of LPF and a high pass filter may be used depending on communication systems used. The W-transmission filter 110 has a terminal for connection to the W-transmit circuits at its one end and is connected to the phase shifter 101 at its other end. The W-reception filter 140 has terminals for connection to W-receive circuits (W-receiver 150) at its one end and is connected to the transmission line for phase shift 102 at its other end. In this embodiment, the terminals for connection to the W-receiver 150 of the W-reception filter 140 have a differential construction having an excellent noise-proof property. However, in applications not severe to the noise-proof capability, an unbalance construction may be used. A common terminal 9 of the duplexer, which is at a point of connection between the phase shifter 101 and the transmission line for phase shift 102, is connected to the antenna 1 via the switch 90.

The G-transmission filter 211 has terminals for connection to the G-transmit circuits at its one end, and is connected to the switch 90 at another end. The G-reception filters 241a and 241b have terminals for connection to the G-receive circuits (G-receiver 250) at their one ends and are connected to the switch 90 at their other ends.

A description is made below of the principle of the duplexer 100 distributing RF transmission signals only from the transmit circuits to the antenna, and RF reception signals only from the antenna to only the receive circuits. The phase shifter 101 has, in W-transmission frequencies, characteristic impedance well matched to both the impedance of the antenna (antenna 1 through the switch 90 in this embodiment) and the impedance of the W-transmission filter 110, and conveys power from the W-transmission filter 110 to the antenna with very little loss. On the other hand, in W-reception frequencies, since the impedance of the W-transmission filter 110 differs from impedance in the transmission frequency, the phase shifter 101 rotates phases so that the impedance appears to be open at the common terminal 9.

Likewise, the transmission line for phase shift 102 has, in W-reception frequencies, characteristic impedance well matched to both the impedance of the antenna and the impedance of the W-reception filter 140, and conveys power from the W-reception filter 140 to the antenna with very little loss. On the other hand, in W-transmission frequencies, the transmission line for phase shift 102 rotates phases so that the impedance of the W-reception filter 140 appears to be open at the common terminal 9. Thereby, in any of W-transmission frequencies and W-reception frequencies, since a filter not used appears to be open or disconnected at the common terminal 9, in the duplexer 100, RF transmission signals are distributed only from the transmit circuits to the antenna, and RF received signals are distributed only from the antenna to the receive circuits.

In this embodiment, as a circuit that rotates phases between the filters and the common terminal 9, the transmission side uses a phase shifter that advances phases, while the reception side uses a transmission line for phase shift that delays phases. However, since a rotation phase quantity depends on the value of out-of-band impedance of a filter used, a combination other than combinations of this embodiment may be adopted in line with the filter used. To delay phases between the filters and the common terminal 9, in addition to the transmission line for phase shift as shown in this example, a phase shifter that delays phases, as typified by a circuit with C and L transposed in the phase shifter of this example, may be used.

A multi-mode front end part constructed as described above is mounted on the module substrate 21 as shown in FIG. 7A, and installed as the multi-mode FEM 11. The transmission line for phase shift 102 and the G-dual band transmission filter 212 are formed in a conductor pattern in the module substrate 21 as shown in FIG. 7B. Between a surface layer on which parts of the module substrate 21 are mounted, and an internal layer on which the transmission line for phase shift 102 and the G-dual band transmission filter 211 are formed, a grounded conductor face (not shown) is provided to prevent signal interference from occurring between the surface layer and the internal layer.

In the multi-mode FEM 11, a G-dual band reception filter 241a, which is a circuit (fourth circuit) independent of the circuit operation of W-CDMA system, is disposed in a section of the shortest distance between the W-transmission filter 110 and the W-reception filter 140 of the duplexer 100 that handles RF transmission/received signals of the W-CDMA system. This construction enables the allocation of a space of such a sufficient distance as not to cause signal interference between the W-transmission filter 110 handling RF transmission signals of the FDD system in which transmission and reception operate at the same time, and the W-reception filter 140 handling RF received signals. As a result, with high performance maintained, the G-dual band reception filter 241a not influencing W-CDMA operation can be provided in a free space to effectively utilize the area of the module substrate 21, so that the multi-mode FEM on which the RF circuit for multi-mode operation is mounted can be reduced in size.

Figure 8A:
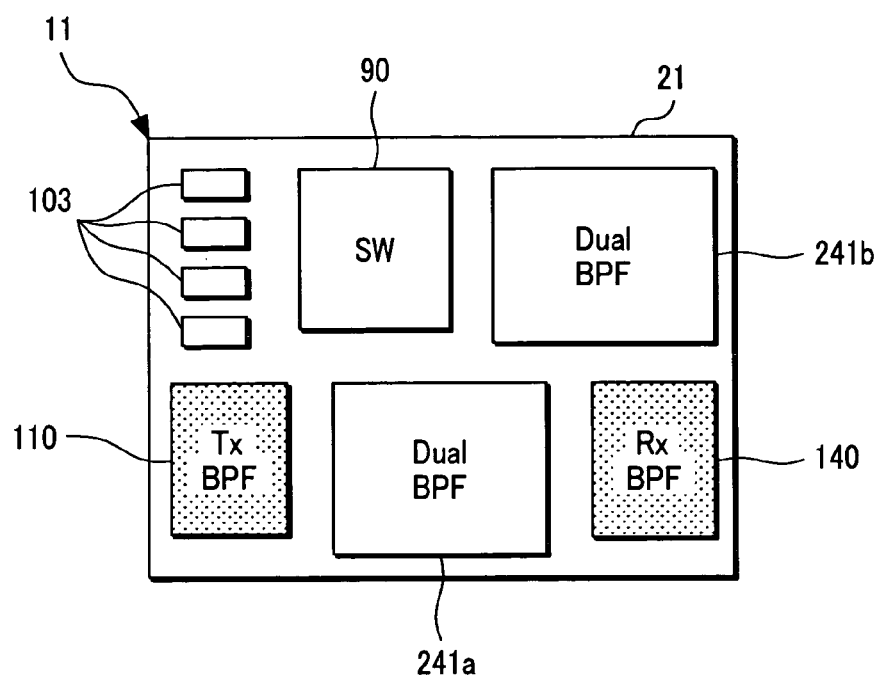
FIG. 8A is another layout diagram for explaining the front end module of the second embodiment.
Figure 8B:
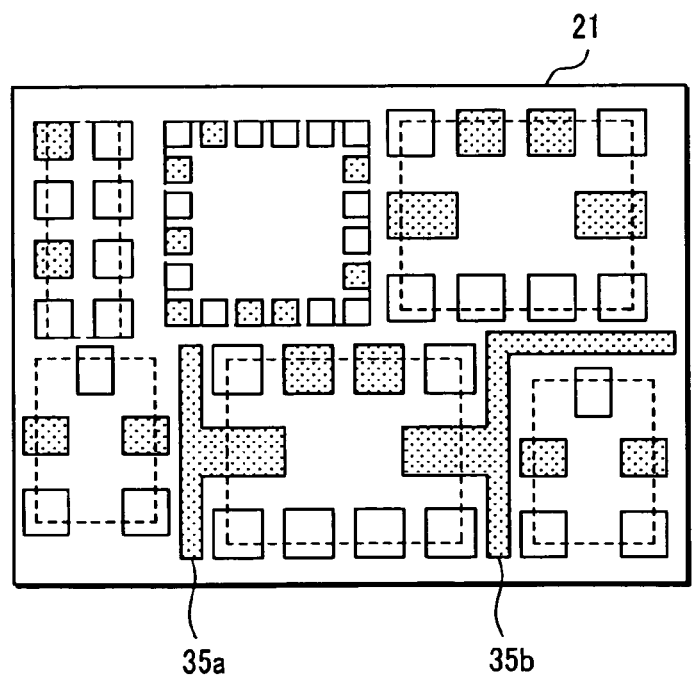
FIG. 8B is another pattern diagram for explaining the front end module of the second embodiment.

By providing a grounded conductor pattern between the W-transmission filter 110 and G-dual band reception filter 241a, and providing another grounded conductor pattern between the W-reception filter 140 and the G-dual band reception filter 241a, signal interference can be further reduced. A multi-mode FEM 11 thus constructed is shown in FIGS. 8A and 8B. FIG. 8A is a layout diagram of the FEM, and FIG. 8B is a surface-layer pattern diagram of the substrate 21. A grounded conductor pattern 35a and a grounded conductor pattern 35b are formed on a surface layer. The phase shifter 101 comprises passive elements 103. The grounded conductor pattern 35a is disposed between the W-transmission filter 110 and G-dual band reception filter 241a, and the grounded conductor pattern 35b is disposed between the G-dual band reception filter 241a and the W-reception filter 140.

The grounded conductor patterns 35a and 35b are connected to a grounded conductor plane (not shown) of an internal layer of the module substrate 21 by via holes (not shown). The ground terminals of the G-dual band reception filter 241a are provided with conductor patterns so that they are connected to the grounded conductor patterns 35a and 35b, respectively.

Like the FEM 21 in FIG. 7A, this construction enables the allocation of a space of such a sufficient distance as not to cause signal interference between the W-CDMA transmission filter 110 and the W-CDMA reception filter 140. As a result, with high performance maintained, the area of the module substrate can be effectively utilized, so that the multi-mode FEM on which the RF circuit for multi-mode operation is mounted can be reduced in size. In addition, as described in the first embodiment, since grounded conductors are provided in the respective spaces among the W-transmission filter 110, the G-dual band reception filter 241a, and the W-CDMA reception filter 140 being a fourth circuit, signal leak from the transmit circuits to the receive circuits can be further reduced. Depending on the target of interference reduction, any one of the grounded conductor pattern 35a or the grounded conductor pattern 35b may be installed as a grounded conductor pattern.

<Third Embodiment>

Figure 9:
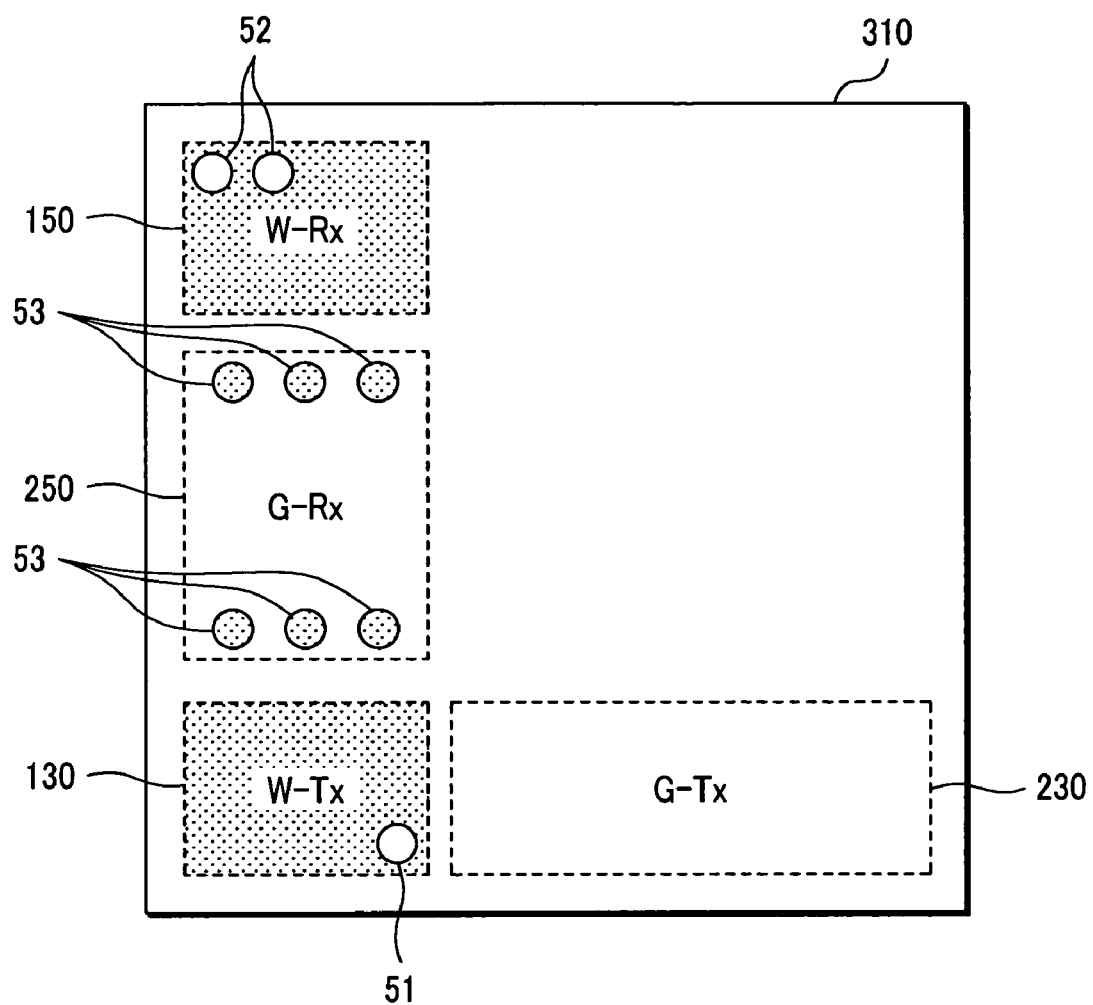
FIG. 9 is a layout diagram of an integrated circuit chip for explaining a third embodiment of the present invention.

FIG. 9 shows a third embodiment of the present invention. The RF circuit for multi-mode operation of this embodiment has a higher grounding effect in the multi-mode RF-IC 310 than that in the first embodiment. In this embodiment, a G-receiver 250, which is a circuit (tenth circuit) independent of the circuit operation of W-CDMA, is disposed in a section of the shortest distance between a W-transmitter 130 (first transmitter) and a W-receiver 150 (second receiver). This construction enables the allocation of a space of such a sufficient distance as not to cause signal interference between the W-CDMA transmitter 130 and the W-CDMA receiver 150. With high performance maintained, since the GSM receiver 250 not influencing W-CDMA operation can be provided in a free space, the chip area can be effectively utilized, so that the multi-mode RF-IC on which the RF circuit for multi-mode operation is integrated can be reduced in size.

The multi-mode RF-IC 310 of this embodiment is assumed to be flip-chip mounted on a substrate of a device in which it is used. An output bump 51 is provided on the W-transmitter 130, an input bump 52 is provided on the W-receiver 150, and grounding bumps 53 are provided on the G-transmitter 230. The grounding bumps 53 are provided at each of the W-transmitter 130 side and the W-receiver 150 side. By being connected to grounded conductors on a substrate of a device in which the multi-mode RF-IC 310 is used, the grounding bumps 53 become equivalent to the grounded conductors. By this construction, as described in the first embodiment, the same effect is obtained as when at least one grounded conductor is provided in the respective spaces among the W-transmitter 130 being a first transmitter, the G-receiver 250 being a tenth circuit, and the W-receiver 150 being a first receiver, and signal leak from the transmit circuits to the receive circuits can be further reduced. Depending on the target of interference reduction, the grounding bumps 53 may be placed in any one of the W-transmitter 130 side or the W-receiver 150 side.

<Fourth Embodiment>

Figure 10:
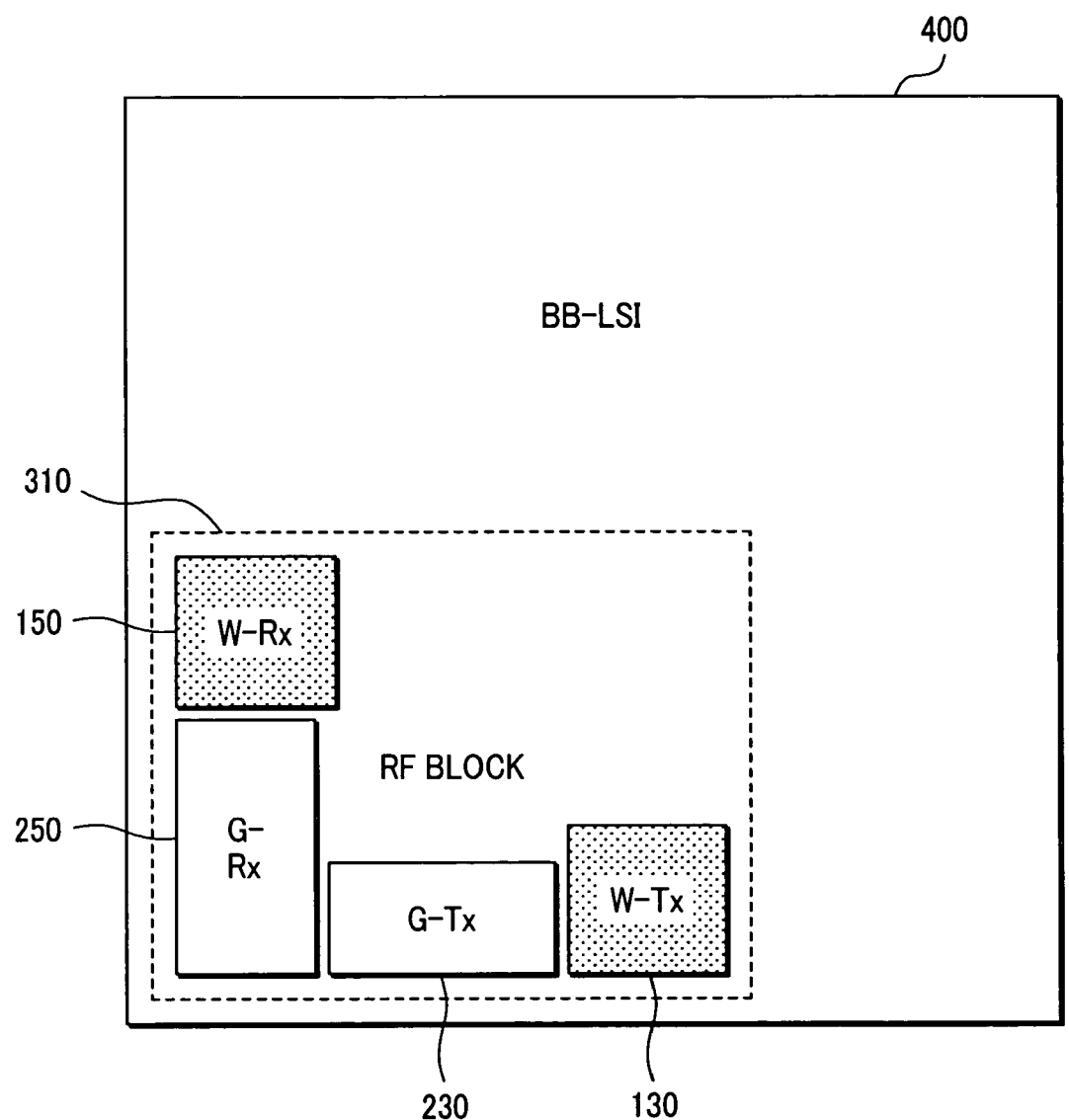
FIG. 10 is a layout diagram of an integrated circuit chip for explaining a fourth embodiment of the present invention.
Figure 15:
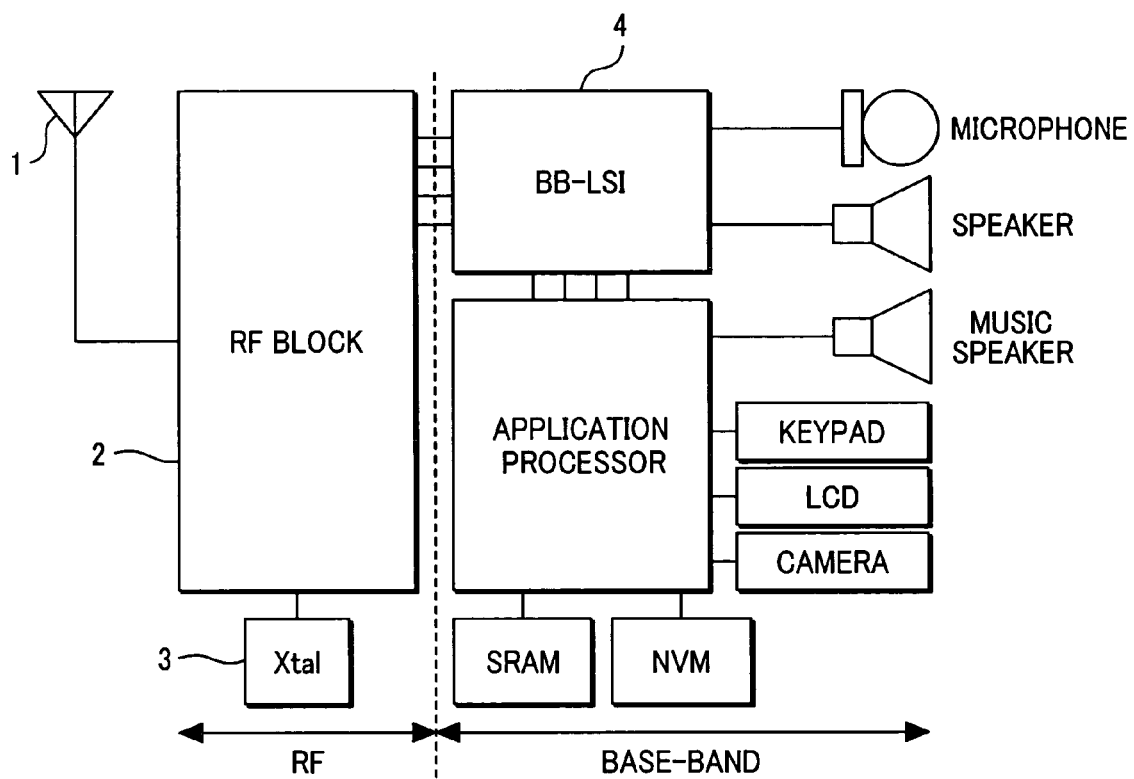
FIG. 15 is a block diagram of a common cellular phone.

FIG. 10 shows a fourth embodiment of the present invention. The RF circuit for multi-mode operation of this embodiment is an integration of the multi-mode RF-IC 310 in the first embodiment and a BB-LSI 4 shown in FIG. 15 into a BB-LSI 400. The disposition of the multi-mode RF part in the BB-LSI 400 is the same as the disposition of the multi-mode RF-IC 310 shown in FIG. 1B or FIG. 5. The BB-LSI 400 is disposed, for example, in the position of the multi-mode RF-IC 310 in FIG. 1B.

By the above-described construction of the BB-LSI 400, signal interference between the W-transmitter 130 and the W-receiver 150 is reduced, while circuits not influencing W-CDMA operation are provided in a free space to effectively utilize an area on the chip, whereby the RF circuit for multi-mode operation on the BB-LSI 400 chip can be realized with high performance and a small area. As a result, the BB-LSI 400 chip on which the RF circuit for multi-mode operation is integrated has been realized with a small area. Since the BB-LSI 400 is small in size, more chips can be produced in one wafer process, resulting in a reduction in chip prices.

<Fifth Embodiment>

Figure 11:
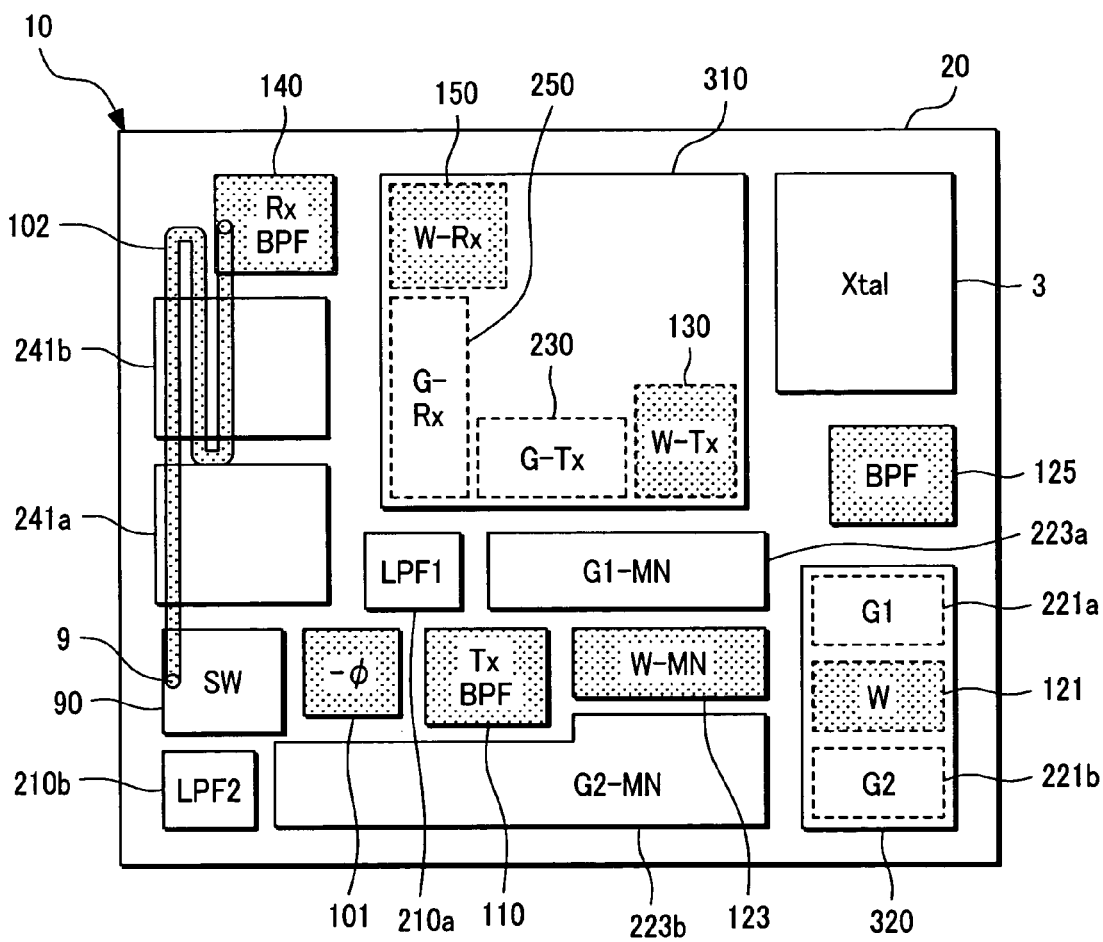
FIG. 11 is a layout diagram of an RF circuit module for explaining a fifth embodiment of the present invention.

FIG. 11 shows a fifth embodiment of the present invention. The construction of the RF circuit for multi-mode operation of this embodiment is the same as that shown in FIG. 1A. FIG. 11 is a layout diagram of an RF circuit module provided with the RF circuit for multi-mode operation. In this embodiment, a first communication system is W-CDMA, and a second communication system is GSM. The RF circuit module in this embodiment has the following four points of difference from the RF circuit module shown in FIGS. 1A and 1B in the first embodiment. First, in place of the duplexer 100, components of a duplexer circuit such as the W-transmission filter (Tx-BPF) 110, the W-reception filter (RxBPF) 140, the phase shifter (−Φ) 101, and the transmission line for phase shift 102 are used. Second, in place of the W-PA 121 and the G-dual band PA 222, a multi-mode PA-IC 320 with the both integrated into one chip is used. Third, a breakdown voltage of the W-PA 121 is increased to make an isolator unnecessary. Fourth, two G-transmission filters 210a and 210b are used in place of the G-dual band transmission filter 211. A G-dual band PA comprises a G1-PA 221a and a G2-PA 221b.

The RF circuit module 10 of this embodiment has RF circuits of the W-CDMA system and the GSM system disposed as described below on the module substrate 20. First, the G1-PA 221a, a G1 output matching network 233a, the G-transmission filter 210a, the G-transmitter 230, and the G-receiver 250, which are circuits of the GSM system independent of the circuit operation of W-CDMA, are disposed in a section of the shortest distance between the W-PA 121, W-output matching network 123, W-transmission filter 110 and phase shifter 101, which handle RF transmission signals of W-CDMA, and the W-receiver 150 that handles RF received signals of W-CDMA.

Next, the G1-PA 221a and a G1-output MN 223a, which are circuits of the GSM system independent of the circuit operation of W-CDMA, are disposed in a section of the shortest distance between the W-transmitter 130 that outputs RF transmission signals of W-CDMA, and the W-PA 121 that amplifies RF transmission signals outputted from the W-transmitter 130. And, G1-PA 221a, which is a circuit of the GSM system independent of the circuit operation of W-CDMA, is disposed in a section of the shortest distance between the W-PA 121, and the W-inter stage filter 125 that limits the bandwidth of RF transmission signals of W-CDMA. Furthermore, the G1 output matching network 233a, the G-transmitter 230, and the G-receiver 250, which are circuits (ninth circuits) independent of the circuit operation of W-CDMA, are disposed in a section of the shortest distance between the W-PA 121, and the W-reception filter 140 (second filter) that limits the bandwidth of RF received signals of W-CDMA.

In this embodiment, a transceiver of the GSM system accommodates four frequency bands 1, 2, 3, and 4. The G1-PA 221a, the G1-output matching network 223a, and the G1-transmission filter 210a, which are circuits (fifth circuit) handling RF transmission signals of bands 1 and 2 (first frequency band) of GSM, are included in the circuits disposed in a section of the shortest distance between the W-PA 121, W-output matching network 123, W-transmission filter 110 and phase shifter 101, which handle RF transmission signals of W-CDMA, and the W-receiver 150 that handles RF received signals of W-CDMA The G2-PA 221b, G2-output matching network 223b, and G2-transmission filter 210b, which are circuits (sixth circuit) that handle RF transmission signals of bands 3 and 4 (second frequency band) of GSM are not included in these circuits. Therefore, as a result, the W-PA 121, W-output matching network 123, W-transmission filter 110, and phase shifter 101, which are circuits of the W-CDMA system independent of the circuit operation of GSM, are disposed in a section of the shortest distance between the G1-PA 221a, G1-output matching network 223a and G1-transmission filter 210a, which handle RF transmission signals of bands 1 and 2 of GSM, and G2-PA 221b, G2-output matching network 223b, and G2-transmission filter 210b that handle RF transmission signals of bands 3 and 4 of GSM.

This construction enables the respective reductions in signal interference from the W-CDMA transmit circuits to the receive circuits in W-CDMA operation, signal interference from the W-CDMA power amplifier to the transmitters, and thermal conduction from the W-CDMA power amplifiers to the inter stage filters and the reception filters. Therefore, while excellent performances such as good sensitivity, output characteristics not causing oscillation phenomenon, and low spurious radiation are achieved, the area of multi-mode RF module can be reduced.

Furthermore, in GSM operation, the section of the shortest distance between the circuits that handle RF transmission signals of bands 1 and 2 of GSM, and the circuits that handle RF transmission signals of bands 3 and 4 is sufficiently isolated by providing circuits independent of the GSM operation, and the so-called cross-band coupling—higher harmonics of RF transmission signals of bands 3 and 4 are coupled to circuits that handle RF transmission signals of bands 1 and 2—can be reduced. As a result, the excellent performance of spurious radiation being low even in the GSM operation can be achieved.

In the RF circuit module 10 of this embodiment, the G1-transmission filter 210a and the G-dual band reception filter 241b, which are circuits independent of W-CDMA operation, are disposed in a section of the shortest distance between the W-transmission filter 110 constituting a duplexer of W-CDMA and the W-reception filter 140. Furthermore, an RF received signal path in which the transmission line for phase shift 102 formed by a conductor pattern on an internal layer of the module substrate 20 runs from the common terminal 9 of the duplexer to the W-reception filter 140 is, in most sections, almost orthogonal to an RF transmission signal path that runs to the common terminal 9 via the W-output matching network 123, W-transmission filter 110, and phase shifter 101 from the output terminal of the W-PA 121 that amplifies RF transmission signals of W-CDMA.

By this construction, since signal interference from the transmission filters of W-CDMA to the reception filters can be reduced in W-CDMA operation, while good sensitivity is achieved, the area of the multi-mode RF module can be reduced in size. Furthermore, In W-CDMA operation in the RF circuit module of this embodiment, since magnetic coupling between the path that handles the largest RF transmission signal, and the path that handles the smallest RF received signal can be reduced, higher sensitivity can be achieved.

<Sixth Embodiment>

Figure 12:
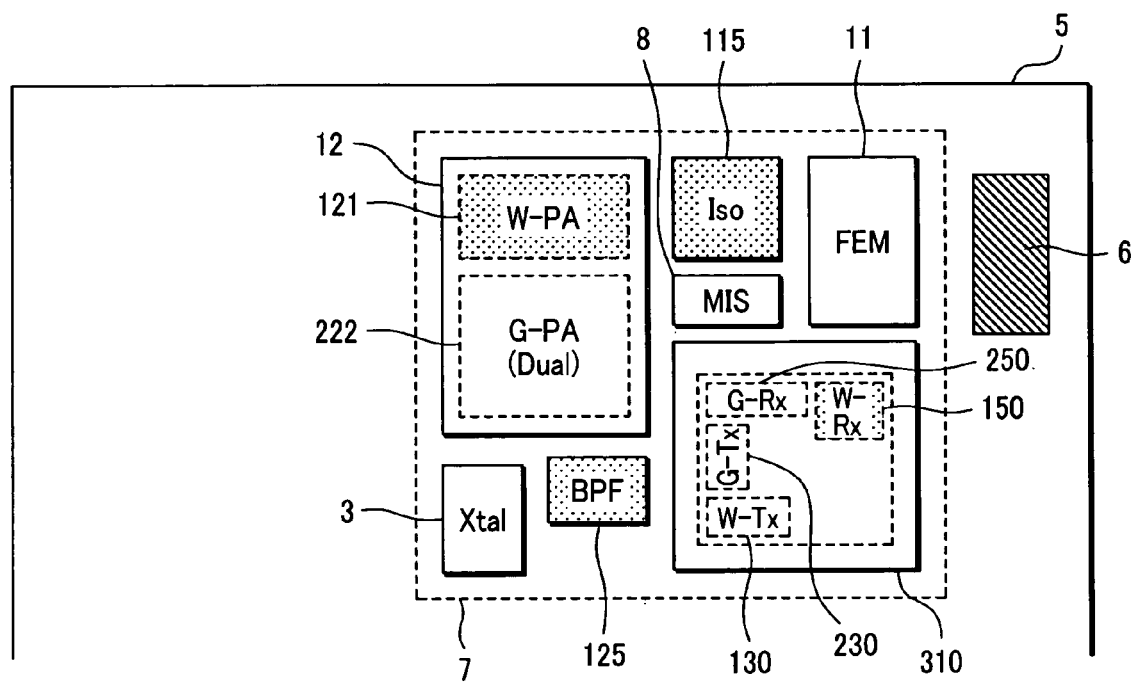
FIG. 12 is a layout diagram of a mother board of a cellular phone for explaining a sixth embodiment of the present invention.

FIG. 12 shows a sixth embodiment of the present invention. In this embodiment, the RF circuit for multi-mode operation is mounted on a mother board in a cellular phone. The construction of the RF circuit mounted in the RF circuit module of this embodiment is the same as the circuit construction described in FIG. 1A. In this embodiment, a first communication system is W-CDMA, and a second communication system is GSM.

The RF circuit for multi-mode operation mounted on the mother board 5 comprises multi-mode FEM 11, isolator 115, a multi-mode PAM 12 on which W-PA 121, G-dual band PA 222, and their respective matching networks (not shown) are mounted, W-inter stage filter 125, multi-mode RF-IC 310, Xtal 3, and a miscellaneous circuit 8.

These circuits are shielded by the shield 7 to prevent electromagnetic interference with a BB part (not shown). An antenna terminal of the multi-mode FEM 11 is electrically connected with the antenna terminal 6 on the mother board. An antenna 1 (not shown) is connected to the antenna terminal 6 so that signals are transferred between the RF part and the antenna. Further, the multi-mode FEM 11 used in this embodiment is the same as that described in the second embodiment shown in FIGS. 8A and 8B. The multi-mode RF-IC 310 is packaged by mounting that described in the first embodiment shown FIG. 5 on a lead frame and sealing it with plastic.

In this embodiment, the miscellaneous circuit 8 and the G-receiver 250, which are circuits independent of the circuit operation of W-CDMA, are disposed in a section of the shortest distance between the W-PA 121 and the isolator 115, which handles RF transmission signals of W-CDMA, and the W-receiver 150 that handles RF received signals of W-CDMA. The G-dual band PA 222, which is a circuit of the GSM system independent of the circuit operation of W-CDMA, is disposed in a section of the shortest distance between the W-transmitter 130 that outputs RF transmission signals of W-CDMA, and the W-PA 121 that amplifies RF transmission signals outputted from the W-transmitter 130. The G-PA 222, which is a circuit independent of the circuit operation of W-CDMA, is disposed in a section of the shortest distance between the W-PA 121 that amplifies RF transmission signals of W-CDMA, and the W-inter stage filter 125 that limits the bandwidth of RF transmission signals of W-CDMA.

This construction enables the respective reductions in signal interference from the W-CDMA transmit circuits to the receive circuits in W-CDMA operation, signal interference from the W-CDMA power amplifier to the transmitters, and thermal conduction from the W-CDMA power amplifiers to the inter stage filters. Therefore, while excellent performances such as good sensitivity, output characteristics not causing oscillation phenomenon, and low spurious radiation are achieved, the RF part in the mother board of cellular phones can be reduced.

As the miscellaneous circuit 8 in this embodiment, a power bypass condenser for the G-receiver 250, G-transmitter 230, or G-dual band PA 222, which are independent of W-CDMA operation may be used. When a space occurs for convenience of layout of the mother board, a grounded conductor may be provided. In the position of the miscellaneous circuit 8, a reinforcing conductor for keeping an interval between the shield 7 and the mother board 5 may be provided between the shield 7 and the mother board 5. Such a reinforcing conductor may not have shielding effects to completely separate the spaces of the multi-mode PAM 12 and the multi-mode RF-IC 310 because the interval of the shortest distance between the W-PA 121 and the isolator 115, and the W-receiver 150 is sufficiently isolated by the G-receiver 250 and the like to such an extent as not to cause signal interference.

<Seventh Embodiment>

Figure 13:
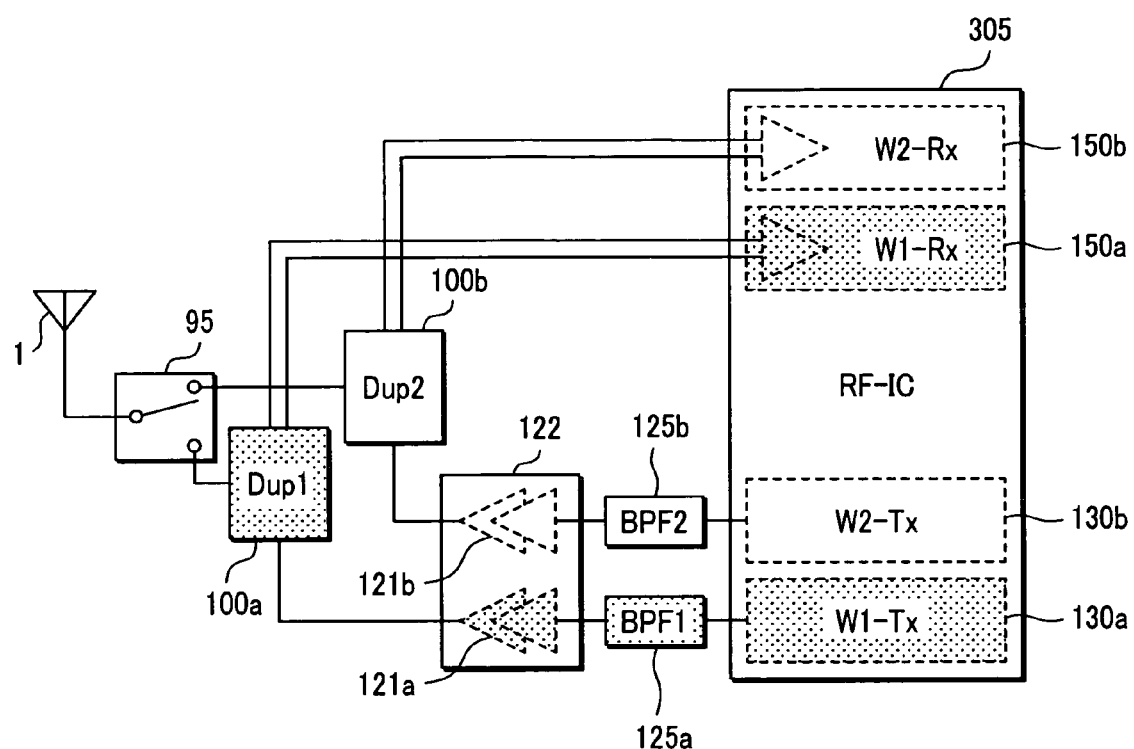
FIG. 13 is a block diagram for explaining a seventh embodiment of the present invention.
Figure 14:
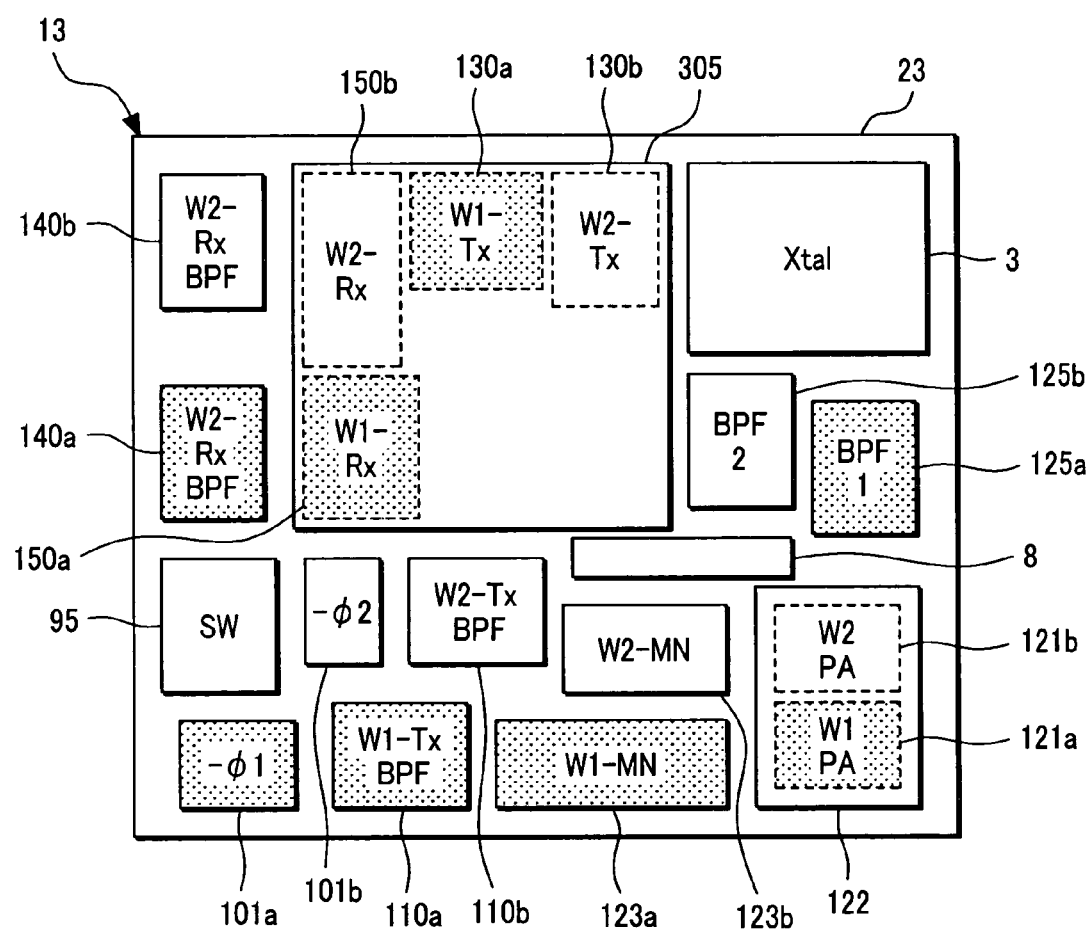
FIG. 14 is a layout diagram of an RF circuit module provided with the RF circuit for multi-mode operation of a seventh embodiment.

FIGS. 13 and 14 show a seventh embodiment of the present invention. The RF circuit for multi-mode operation of this embodiment complies with two W-CDMA systems with different frequency bands. FIG. 13 is a circuit diagram of the RF circuit for multi-mode operation, and FIG. 14 is a layout diagram of an RF circuit module provided with the RF circuit for multi-mode operation. In this embodiment, a first communication system is W-CDMA used for the first frequency band, and a second communication system is W-CDMA used for the second frequency band.

As the RF circuit mounted in the RF circuit module, a circuit for W-CDMA that uses the first frequency band includes a duplexer (Dup1) 100*a*, W-PA 121*a*, W-inter stage filter (BPF1) 125*a*, W-transmitter (W1-Tx) 130*a*, and W-receiver (W1-Rx) 150*a*. And, a circuit for W-CDMA that uses the second frequency band includes a duplexer (Dup2) 100*b*, W-PA 121*b*, W-interstage filter (BPF2) 125*b*, W-transmitter (W2-Tx) 130*b*, and W-receiver (W2-Rx) 150*b*. Common terminals of the duplexer 100*a* and the duplexer 100*b* are respectively connected to a switch (SW) 95, and which of the duplexers is connected with the antenna 1 is determined by the switch 95. W-PAM 121*a* and W-PAM 121*b* are integrated on W-dual band PA 122. And, W-transmitters 130*a* and 130*b*, and W-receivers 150*a* and 150*b* are integrated on W-dual band RF-1C 305. In this embodiment, since a device having an improved breakdown voltage is used for PA, no isolator is used in this construction. Like the duplexer shown in FIG. 6, the duplexer 100*a* comprises W-transmission filter 110*a*, phase shifter (−Φ1) 101*a*, and a transmission line for phase shift (+Φ1) not shown in the drawing. The duplexer 100*b* comprises W-transmission filter 10*b*, phase shifter (−Φ2) 101*b*, and another transmission line for phase shift (+Φ2).

In this embodiment, as shown in FIG. 14, the above-described circuits and the Xtal 3 are mounted as described below on the module substrate 23 to form the RF circuit for multi-mode operation module 13. First, the operation of the W-CDMA system that uses the first frequency band will be examined. The W-PA 121*b*, W-output matching network 123*b*, W-transmission filter 110*b*, and phase shifter 101*b*, which are circuits of W-CDMA that uses the second frequency band and that are independent of the circuit operation of W-CDMA that uses the first frequency band are disposed in a section of the shortest distance between the W-PA 121*a*, W-output matching network 123*a*, W-transmission filter 110*a* and phase shifter 101*a*, which handle RF transmission signals of W-CDMA that uses the first frequency band, and the W-receiver 150*a* that handles RF received signal of W-CDMA that uses the first frequency band. The W-PA 121 band a miscellaneous circuit and the like on W-dual band RF-IC 305, which are circuits of W-CDMA that uses the second frequency band and that are independent of the circuit operation of W-CDMA that uses the first frequency band are disposed in a section of the shortest distance between the W-transmitter 130*a* that outputs RF transmission signals of W-CDMA that uses the first frequency band, and W-PA 121*a* that amplifies RF transmission signals outputted from the W-transmitter 130*a*. Furthermore, the W-PA 121*b*, which is a circuit of W-CDMA that uses the second frequency band that is independent of the circuit operation of W-CDMA that uses the first frequency band is disposed in a section of the shortest distance between the W-PA 121*a* that amplifies RF transmission signals of W-CDMA and that uses the first frequency band, and the W-inter stage filter 125*a* that limits the bandwidth of RF transmission signals of W-CDMA that uses the first frequency band.

Next, the operation of the W-CDMA system that uses the second frequency band will be examined. The W-receiver 150*a*, extra circuits on the W-dual band RF-IC 305, and the miscellaneous circuit 8 and the like, which are circuits of W-CDMA that uses the first frequency band that are independent of the circuit operation of W-CDMA and that uses the second frequency band are disposed in a section of the shortest distance between the W-PA 121*b*, W-output matching network 123*b*, W-transmission filter 110*b* and phase shifter 101*b*, which handle RF transmission signals of W-CDMA that uses the second frequency band, and the W-receiver 150*b* that handles RF received signal of W-CDMA that uses the second frequency band. The extra circuits on the W-dual band RF-IC 305 and the miscellaneous circuit 8 and the like, which are circuits of W-CDMA that uses the second frequency band that is independent of the circuit operation of W-CDMA that uses the second frequency band are disposed in a section of the shortest distance between the W-transmitter 130*b* that outputs RF transmission signals of W-CDMA that uses the second frequency band, and W-PA 121*b* that amplifies RF transmission signals outputted from the W-transmitter 130*b*. Furthermore, the miscellaneous circuit 8, which is a circuit of W-CDMA that uses the second frequency band and that is independent of the circuit operation of W-CDMA that uses the second frequency band is disposed in a section of the shortest distance between the W-PA 121*b* that amplifies RF transmission signals of W-CDMA that uses the second frequency band, and the W-inter stage filter 125*b* that limits the bandwidth of RF transmission signals of W-CDMA that uses the second frequency band. To the miscellaneous circuit 8 in this embodiment, a bypass condenser of a power circuit that feeds power to the W-CDMA circuits that use the first frequency band of the W-CDMA dual band RF-IC 305 is applied.

By the above-described construction, when any one of the W-CDMA RF circuit that uses the first frequency band, and the W-CDMA RF circuit that uses the second frequency band is operated, signal interference from the transmit circuits to the receive circuits, signal interference from the power amplifier to the transmitters, and thermal conduction from the power amplifiers to the inter stage filters can be respectively reduced. As a result, while excellent performances such as good sensitivity, output characteristics not causing oscillation phenomenon, and low spurious radiation are achieved, the RF module provided with the RF circuit for multi-mode operation that accommodate two W-CDMA frequency bands can be miniaturized.

It is further understood by those skilled in the art that the foregoing description is a preferred embodiment of the disclosed device and that various changes and modifications may be made in the invention without departing from the spirit and scope thereof.

What is claimed is:

1. A radio frequency circuit that complies with plural communication systems, the radio frequency circuit comprising:
    a first circuit that handles radio frequency transmission signals of maximum power in the radio frequency circuit for a first communication system included in the plural communication systems; and
    a second circuit that handles received radio frequency signals of minimum amplitude in the radio frequency circuit for the first communication system,
    wherein, when the radio frequency circuit is mounted on a substrate, a third circuit is disposed in a section of the shortest distance between the first circuit and the second circuit, the third circuit handling signals of a second communication system that is included in the plural communication systems and being independent of circuit operation of the first communication system.

2. The radio frequency circuit according to claim 1, wherein the first communication system is a frequency division duplex system.

3. The radio frequency circuit according to claim 1, further comprising:
    a duplexer that handles the transmission/received signals of the first communication system,
    wherein the duplexer includes a transmission filter and a reception filter, and
    wherein a fourth circuit is disposed in a section of the shortest distance between the transmission filter and the reception filter, the fourth circuit handling signals of the second communication system.

4. The radio frequency circuit according to claim 3, wherein a grounded conductor is provided between the transmission filter and the fourth circuit, and/or between the fourth circuit and the reception filter.

5. The radio frequency circuit according to claim 3, wherein a received radio frequency signal path that runs from a common terminal of the duplexer to the reception filter, and a radio frequency transmission signal path that runs from an output terminal of a power amplifier that handles the transmission signals of the first communication system, to the common terminal via the transmission filter are almost orthogonal to each other in most sections.

6. The radio frequency circuit according to claim 1, wherein the third circuit is at least one of a circuit that handles radio frequency transmission signals, and a circuit that handles received radio frequency signals, both of the radio frequency transmission signals and the received radio frequency signals being of the second communication system.

7. The radio frequency circuit according to claim 6, wherein the second communication system is a time division duplex system.

8. The radio frequency circuit according to claim 1, further comprising:
    a fifth circuit that handles radio frequency transmission signals of a first frequency band of the second communication system; and
    a sixth circuit that handles radio frequency transmission signals of a second frequency band of the second communication system,
    wherein the fifth circuit is included in the third circuit, and the sixth circuit is not included in the third circuit.

9. The radio frequency circuit according to claim 8, wherein the second circuit is disposed in a section of the shortest distance between the fifth circuit and the sixth circuit.

10. The radio frequency circuit according to claim 1, wherein the first circuit, the second circuit, and the third circuit are integrated on an integrated circuit chip.

11. The radio frequency circuit according to claim 10, wherein the first circuit and the second circuit are respectively formed at both corners on a diagonal line of the integrated circuit chip.

12. The radio frequency circuit according to claim 11, wherein at least one grounded conductor is provided between the first circuit and the third circuit, and/or between the third circuit and the second circuit.

13. The radio frequency circuit according to claim 10, wherein directions of wires respectively connected to an output terminal of the first circuit, and an input terminal of the second circuit are orthogonal to each other.

14. The radio frequency circuit according to claim 10, wherein the radio frequency circuit is integrated to a base-band large scale integrated circuit that generates a base-band transmission signal inputted to the radio frequency circuit, and inputs a received base-band signal that is outputted from the radio frequency circuit handling signals of the second communication system.

15. A radio frequency circuit that complies with plural communication systems, the circuit comprising:
    a transmitter that outputs radio frequency transmission signals of a first communication system included in the plural communication systems; and
    a power amplifier that amplifies the radio frequency transmission signals outputted by the transmitter,
    wherein, when the radio frequency circuit is mounted over a substrate, a seventh circuit is disposed in a section of the shortest distance between the transmitter and the power amplifier, the seventh circuit handling signals of a second communication system that is included in the plural communication systems and being independent of circuit operation of the first communication system.

16. The radio frequency circuit according to claim 15, further comprising:
a first filter that limits a bandwidth of the radio frequency transmission signal,
wherein an eighth circuit is disposed in a section of the shortest distance between the power amplifier and the first filter, the eighth circuit handling signals of the second communication system.

17. The radio frequency circuit according to claim 15, further comprising:
a second filter that limits a bandwidth of received radio frequency signals of the first communication system,
wherein a ninth circuit is disposed in a section of the shortest distance between the power amplifier and the second filter, the ninth circuit handling signals of the second communication system.

18. A radio frequency circuit that complies with at least a code division multiple access system and a time division multiple access system, the radio frequency circuit comprising:
a first circuit mounted over a substrate, which handles transmission signals of maximum power in the radio frequency circuit for the code division multiple access system;
a second circuit mounted over the substrate, which handles received signals of minimum amplitude in the radio frequency circuit for the code division multiple access system; and
a third circuit that is mounted over the substrate and is disposed in a section of the shortest distance between the first circuit and the second circuit,
wherein the third circuit is at least one of a circuit that handles transmission signals of the time division multiple access system, and a circuit that handles received signals of the time division multiple access system.

19. The radio frequency circuit according to claim 18,
wherein the first circuit includes a power amplifier that handles transmission signals of the code division multiple access system,
wherein, when the third circuit is the circuit that handles the transmission signals of the time division multiple access system, the third circuit includes a power amplifier that handles the transmission signals of the time division multiple access system, and
wherein the second circuit is integrated in a semiconductor circuit chip.

* * * * *